United States Patent [19]
Kuwata et al.

[11] Patent Number: 6,064,236
[45] Date of Patent: May 16, 2000

[54] PHASE DETECTOR AND TIMING EXTRACTING CIRCUIT USING PHASE DETECTOR

[75] Inventors: Naoki Kuwata; Takuji Yamamoto, both of Kawasaki, Japan

[73] Assignee: Fujitsu Limited, Kanagawa, Japan

[21] Appl. No.: 09/039,595

[22] Filed: Mar. 16, 1998

[30] Foreign Application Priority Data

Oct. 17, 1997 [JP] Japan ..................................... 9-285139

[51] Int. Cl.⁷ .................................................. H03D 13/00
[52] U.S. Cl. ................................ 327/12; 327/24; 327/27; 327/197
[58] Field of Search .................................... 327/2, 3, 5, 7, 327/10, 12, 24, 27, 77, 93, 197, 218; 326/52, 30

[56] References Cited

U.S. PATENT DOCUMENTS

| | | | |
|---|---|---|---|
| 4,380,815 | 4/1983 | Clendening | 375/80 |
| 4,475,183 | 10/1984 | Marchant et al. | 369/59 |
| 4,635,280 | 1/1987 | Smith et al. | 375/120 |
| 4,972,161 | 11/1990 | Davies et al. | 331/1 A |
| 4,985,639 | 1/1991 | Renfrow et al. | 327/24 |
| 5,087,828 | 2/1992 | Sato et al. | 327/24 |
| 5,164,966 | 11/1992 | Herhberger | 375/110 |
| 5,357,144 | 10/1994 | Tanaka | 327/104 |
| 5,396,028 | 3/1995 | Tomassetti | 178/69 |
| 5,455,540 | 10/1995 | Williams | 331/1 A |
| 5,793,680 | 8/1998 | Okajima | 365/189.05 |

FOREIGN PATENT DOCUMENTS

| | | |
|---|---|---|
| 3229669 | 9/1988 | Japan . |
| 413325 | 1/1992 | Japan . |

*Primary Examiner*—Kenneth B. Wells
*Assistant Examiner*—An T. Luu
*Attorney, Agent, or Firm*—Helfgott & Karas, P.C.

[57] ABSTRACT

Disclosed are a phase detector for detecting the phase difference between a data signal and a clock signal, and a timing extracting circuit for controlling the phase of the clock signal so that the phase relationship between the clock signal and the data signal is optimal by using the phase detector. The phase detector includes an edge detector for generating an edge signal at the rising edge and the falling edge of the data signal, and a D flip flop (D-FF) for storing and outputting the logical value of the clock signal at the time of generation of the edge signal, and holding the logical value until the generation of the next edge signal, thereby outputting a signal corresponding to the phase difference between the data signal and the clock signal. A clock generator in the timing extracting circuit having a PLL structure controls the phase of the clock signal so that the difference becomes optimal.

12 Claims, 19 Drawing Sheets

| IN1 (DATA) | IN2 (DATA') | a | b | c | d | OUT(EGS) |
|---|---|---|---|---|---|---|
| + | + | + | − | + | GND | + |
| + | − | + | − | − | GND | − |
| − | + | − | + | GND | − | − |
| − | − | − | + | GND | + | + |

(1) WHEN THE PHASE OF A CLOCK SIGNAL LAGS (2) WHEN THE PHASE OF A CLOCK SIGNAL LEADS

PHASE DETECTOR AND TIMING EXTRACTING CIRCUIT USING PHASE DETECTOR

BACKGROUND OF THE INVENTION

The present invention relates to a timing extracting circuit for extracting the timing for discriminating data in an optical receiver in a high-speed optical communication system and, more particularly, to a timing extracting circuit for controlling the phase of a clock signal so that the phase relationship between the clock signal which indicates the timing for discriminating data and a data signal becomes optimal, and a phase detector for detecting the phase difference between the data signal and the clock signal.

The optical receiver in a high-speed optical communication system converts a data signal of which waveform is distorted during transmission or a data signal carrying noise into a shaped digital signal, in other words, executes what is called data reproduction. In such data reproduction, the optical receiver extracts a clock signal out of a received data signal, and reproduces the shaped data signal by using the extracted clock signal. One of the problem in data reproduction is that the margin for discriminating the data signal is very small due to such distortion or noise. It is therefore necessary to control the phase relationship between the data signal input to a data discriminating portion and an extracted clock signal which indicates the timing for discriminating the data signal so that it is accurately optimal. In addition, it is necessary that the phases relationship between the data signal and the clock signal does not shift. For example, it is necessary to control the phase relationship so that the clock signal for discriminating the data signal rises at the center of the data signal.

FIG. 20 shows an example of the structure of an optical receiver used in an optical communication system. The reference numeral 1 represents an optoelectric conversion circuit for converting an input optical signal (digital signal) into an electric signal, 2 a high-frequency amplifier for amplifying a data signal of, for example, 10 Gbps which is output form the optoelectric conversion circuit 1, 3 a timing extracting circuit for extracting a clock signal having the same frequency as the bit rate of the data signal from the data signal received, 4 an equalizing circuit for executing the equalization control of the data signal, and 5 a discriminating circuit for discriminating the data signal by using the clock signal which is output from the timing extracting circuit 3.

In such an optical receiver, it is necessary to keep the phase relationship between the data signal and the clock signal input to the discriminating circuit 5 optimal. FIG. 21 is an explanatory view of the relationship between a data signal and a clock signal. The symbol DATA represents a data signal and CLOCK a clock signal. When the data D0, D1, . . . are established on the signal line, the clock signal CLOCK should be generated at the center of the data D0, D1, . . . so as to fetch them. In this manner, accurate data discriminating/reproducing operation is enabled.

In the actual system, however, the characteristic of each circuit subtly changes due to the change of the ambient temperature or the fluctuation of the supply voltage, so that the phase relationship between the data signal and the clock signal slips from the optimal state, thereby making the accurate discrimination impossible. Especially, the higher the speed of the data signal to be processed is, the shorter the time slot (the period of one data) becomes, and only a slight change in the phase is apt to make the accurate discrimination impossible.

To solve this problem, some circuits have been proposed which detect the phase relationship between the data signal and the clock signal and control the phase of the clock signal so that the optimal phase relationship is kept. FIG. 22 shows an automatic phase control circuit using two D flip flops (D-FFs) and two exclusive OR gates (EXOR circuits) (IEEE Transaction on Electron Devices VOL. ED-32, No.12 December 1985 "A Self Correcting Clock Recovery Circuit", Hogge, pp. 2704–2706). In FIG. 22, the symbols U1, U4 denote D flip flops (D-FFs) each provided with a clock input terminal (C) to which a first signal is input, a data input terminal (D) to which a second signal is input, and output terminals (Q, *Q) for outputting stored logical values. The D-FF stores and outputs the logical value of the second signal (input of the D) in the instant of the rising edge of the first signal (input of the C) and stores the logical value until the time of the rising edge of the next first signal. The symbols U2, U3 denote EXOR circuits for executing the exclusive OR operation of the input of the D and the output of the Q of the U1 and U4, respectively. The symbol U5 represents a comparator for comparing the average values (the output of a low-pass filter having an R-C structure) of the output signals of the U2 and U3 and outputting a voltage signal corresponding to the difference therebetween, U6 a voltage controlled oscillator for outputting the clock signal CLOCK having a frequency corresponding to the difference signal, and U7 a gate for outputting the non-inverting signal and the inverting signal of the clock signal CLOCK.

When the phase difference between the clock signals of the two D flip flops (D-FFs) U1, U4 are $\pi$, the input and output signals a, b, c of the U1, U4 have the waveforms shown in FIG. 23. The U2, U3 (EXOR circuits) detect the phase information of the input/output signals a, b and b, c of the U1 and U4, respectively, and input the average values of the detection signals d and e to the comparator U5 via the low-pass filter. The comparator U5 outputs the difference between the average values of the detection signals d and e, and the voltage controlled oscillator U6 outputs a clock signal having a frequency and a phase corresponding to the difference. The gate U7 inputs the clock signal to the CLOCK input terminal (C terminal) of the U1 (D-FF) and inputs the inverting signal of the clock signal to the CLOCK input terminal (C terminal) of the U4 (D-FF). Thereafter, the same operation is repeated on the basis of a new clock signal. Owing to such feedback control, the two inputs of the comparator U5, i.e., the outputs of the U2 (EXOR circuit) and U3 (EXOR circuit) are made equal. At this time, a clock signal is generated at the center of the data signal. In FIG. 23, although a clock signal g is generated at the center of the data signal a, the phase of the clock signal g lags or leads the center of the data signal in the beginning. Such a phase lead/phase lag of the clock signal g reduces/increases the pulse width of the output signal of the U2 (EXOR circuit). In contrast, the pulse width of the output signal of the U3 (EXOR circuit) is constant irrespective of a phase lead/phase lag. Consequently, the comparator U5 outputs a difference signal which corresponds to a phase lead/phase lag. However, by the above-described feedback control, the outputs of the U2 (EXOR circuit) and U3 (EXOR circuit) finally become equal, and the clock signal g is generated at the center of the data signal.

When the phase relationship between the data signal a and the clock signal b is optimal, the pulse width of the output of the EXOR circuit is the half of the time slot. This means that the EXOR circuit U2, U3 are required to have an operation speed approximate to the bit rate of the data signal. However, when the phase of a clock signal leads that of the data signal as in the case of pulling, the pulse width of the output of the EXOR circuit becomes narrower. For this reason, the EXOR circuit is required to operate at a higher speed, so that it may fair well be that, especially, a system in which the device does not have a sufficiently high-speed capacity causes a trouble in operation.

FIG. 24 shows the structure of a timing extracting circuit for solving the problem in the conventional circuit shown in FIG. 22. In FIG. 24, the reference numeral 4 represents an equalizing circuit, and 5 a discriminating circuit having a D flip flop (D-FF) 5a. By inputting a data signal to the DATA input terminal D of the flip flop 5a and a clock signal CLOCK to the CLOCK input terminal, the D-FF latches the data signal at the rising edge of the clock signal and holds the state until the next rising edge. In the timing extracting circuit 3, the reference numeral 3a represents a phase detector for outputting a voltage signal which corresponds to the phase difference between the clock signal CLOCK and the data signal DATA, 3b a voltage controlled oscillator (VCO) for oscillating at a frequency corresponding to the input voltage, and 3c a delaying portion for delaying the clock phase by 180°. The output of the delaying portion 3c is input to the C terminal of the first flip flop 5a as a clock signal. In the phase detector 3, the reference numeral 3a-1 represents a D flip flop (D-FF), and 3a-2 a low-pass filter (LPF). The clock signal CLOCK output from the voltage controlled oscillator 3b is input to the DATA input terminal (D terminal) of the D flip flop (D-FF) 3a-1, and the data signal DATA is input to the CLOCK input terminal (C terminal). The output of the D flip flop (D-FF) 3a-1 is averaged by the low-pass filter 3a-2 and then input to the voltage controlled oscillator 3b.

The D-FF 3a-1 stores and outputs the logical value ("1" or "0") of the signal (clock signal CLOCK) input to the DATA input terminal (D terminal) at the rising edge of the signal (data signal DATA) input to the CLOCK input terminal (C terminal), and holds the logical value until the time of the rising edge of the next data signal. Accordingly, when the phase of the clock signal CLOCK lags that of the data signal DATA, as shown in FIG. 25(1), the D-FF 3a-1 outputs a signal D-FF OUT of a low level (=$E_L$). On the other hand, when the phase of the clock signal CLOCK leads that of the data signal DATA, as shown in FIG. 25(2), the D-FF 3a-1 outputs a signal D-FF OUT of a high level (=$E_H$).

As a result, the low-pass filter 3a-2 outputs a voltage signal which is proportional to the phase difference between the clock signal CLOCK and the data signal DATA, and the voltage controlled oscillator 3b oscillates at a frequency corresponding to the voltage signal so that the phase difference becomes zero. The above-described feedback control is thereafter executed, and the phases of the clock signal and the data signal coincide with each other. The delaying portion 3c delays the phase of the clock signal CLOCK by 180° and outputs a clock signal CLOCK which rises at the center of the data signal DATA. Consequently, the discriminating circuit 5 can discriminate the data signal at the center thereof where the margin for discriminating the data signal is the largest. That is, it is possible to make the phase relationship between the data signal DATA and the clock signal CLOCK optimal.

In the phase detector 3a shown in FIG. 24, the rising edge of the data signal DATA is only used for the latch control of the D-FF 3a-1. This method has no problem when the timing at which the data signal rises agrees with the timing at which the data signal trails (when the duty of the data signal is 100%). However, when there is difference in timing (when the duty is not 100%), it is impossible to generate a clock signal CLOCK at the center of the data signal DATA, so that the discriminating circuit 5 cannot discriminate the data signal at the center of the data signal DATA. This state is shown in FIGS. 26A and 26B. The phase detector 3a controls the phase of the clock signal so that the rising edge of the data signal DATA agrees with the rising edge of the clock signal CLOCK. As a result, if the duty of the data signal is 100%, the clock signal CLK which is delayed by 180° from the rising edge of the data signal rises at the center of the data signal DATA, as shown in FIG. 26A. On the other hand, when the duty is less than 100%, the clock signal CLK which is delayed by 180° from the rising edge of the data signal rises not at the center of the data signal DATA but at the position moved from the center by the amount corresponding to the difference between the current duty and 100%, as shown in FIG. 26B.

FIG. 27 shows the structure of a conventional timing extracting circuit for solving the problem in the circuit shown in FIG. 24. The same reference numerals are provided for the elements which are the same as those shown in FIG. 24. In the timing extracting circuit 3, the reference numeral 3a denotes a first phase detector for outputting a voltage signal which corresponds to a phase difference between a clock signal CLOCK and a data signal DATA, 3d a second phase detector for outputting a voltage signal which corresponds to a phase difference between the clock signal CLOCK and the inverting signal *DATA of a data signal DATA, 3e a phase control circuit for controlling the phase of the input clock signal CLOCK IN and outputting a clock signal CLOCK, 3f a differential amplifier for inputting a voltage signal which corresponds to the difference between the output signals of the first and second phase detectors 3a and 3d, 3g an inverting gate for inverting an input data signal DATA IN, and 3c a delaying portion for delaying the clock phase by 180°. The output of the delaying portion 3c is input to the discriminating circuit 5 as a clock signal CLK.

In the phase detector 3a, the reference numeral 3a-1 represents a D flip flop (D-FF), and 3a-2 a low-pass filter. The clock signal CLOCK output from the phase control circuit 3e is input to the DATA input terminal (D terminal) of the D flip flop (D-FF) 3a-1, and the data signal DATA is input to the CLOCK input terminal (C terminal). The output of the D flip flop 3a-1 (D-FF) is averaged by the low-pass filter 3a-2 and then input to the non-inverting input terminal of the differential amplifier 3f. In the phase detector 3d, the reference numeral 3d-1 represents a D flip flop (D-FF), and 3d-2 a low-pass filter. The clock signal CLOCK output from the phase control circuit 3e is input to the DATA input terminal (D terminal) of the D flip flop (D-FF) 3d-1, and the inverting data signal *DATA which is obtained by inverting the data signal is input to the CLOCK input terminal (C terminal). The output *Q of the D flip flop 3d-1 (D-FF) is averaged by the low-pass filter 3d-2 and then input to the inverting input terminal of the differential amplifier 3f. The symbol * represents the inversion of a logical value ("1", "0).

The timing extracting circuit 3 shown in FIG. 27 has an additional D-FF as compared with the timing extracting circuit 3 shown in FIG. 24, so that it is possible to detect the phase relationship between the data signal and the clock signal not only at the rising edge of the data signal but also at the falling edge of the data signal, and deal with a change in the duty of the data signal by averaging the outputs of the two phase detectors 3a and 3d. More specifically, the clock phase is detected at both the rising edge and the falling edge, and the phase control circuit 3e controls the phase of the clock signal so that the output Q of the phase detector 3a and the inverted output (output *Q) of the phase detector 3d are equal. As a result, when the phase of the clock signal CLOCK is delayed by 180° by the delaying portion 3c, a clock signal CLK is generated at the center of the data signal.

According to the timing extracting circuit shown in FIG. 27, even if the duty varies, it is possible to generate a clock signal at the center of the data signal. In such a timing extracting circuit, however, since a D-FF is added to the structure of the timing extracting circuit shown in FIG. 24, the circuitry scale becomes larger. In addition, since two phase detectors are required, the phase adjustment between the two phase detectors is disadvantageously necessary.

SUMMARY OF THE INVENTION

Accordingly, it is an object of the present invention to eliminate the above-described problems in the related art and to provide a timing extracting circuit which is capable of controlling the phase of a clock signal so that the phase relationship between a data signal and a clock signal may be optimal even if the duty of the data signal varies.

It is another object of the present invention to provide a timing extracting circuit which has a small circuitry scale and which can reduce the number of portions necessitating phase adjustment.

It is still another object of the present invention to provide a phase detector which is capable of high-speed operation, which has a small circuitry scale and which is capable of reducing the number of portions necessitating phase adjustment.

To achieve these ends, in a first aspect of the present invention, there is provided a phase detector for detecting the phase difference between a data signal and a clock signal, the phase detector comprising: (1) an edge detector for detecting a rising edge and a falling edge of the data signal and outputting an edge signal; and (2) a D flip flop (D-FF) which is provided with a CLOCK input terminal to which a first signal is input, a DATA input terminal to which a second signal is input and an output terminal for outputting a stored logical value, and which stores and outputs the logical value of the second signal in the instant of a rising edge of the first signal and holds the logical signal until the rising edge of the next first signal, wherein the edge signal is input to the CLOCK input terminal as the first signal, the clock signal is input to the DATA input terminal of the D-FF as the second signal, and a signal corresponding to the phase difference between the data signal and the clock signal is taken out of the output terminal of the D-FF.

In another aspect of the present invention, there is provided a timing extracting circuit for generating a clock signal which indicates the timing for discriminating a data signal and controlling the phase of the clock signal so that the phase relationship between the clock signal and the data signal is optimal, the timing extracting circuit comprising: a phase detector for detecting phase difference between a data signal and a clock signal, and a clock signal generator for generating the clock signal so that the phase difference is optimal; wherein the phase detector having (1) an edge detector for detecting a rising edge and a falling edge of the data signal and outputting an edge signal; and (2) a D flip flop (D-FF) which is provided with a CLOCK input terminal to which a first signal is input, a DATA input terminal to which a second signal is input and an output terminal for outputting a stored logical value, and which stores and outputs the logical value of the second signal in the instant of a rising edge of the first signal and holds the logical signal until the rising edge of the next first signal, wherein the edge signal is input to the CLOCK input terminal of the D-FF as the first signal, the clock signal is input to the DATA input terminal of the D-FF as the second signal, and a signal corresponding to the phase difference between the data signal and the clock signal is taken out of the output terminal of the D-FF.

Other features and advantages of the present invention will be apparent from the following description taken in conjunction with the accompanying drawings.

DESCRIPTION OF THE PREFERRED EMBODIMENTS (A) The outline of the invention

Figure 1:
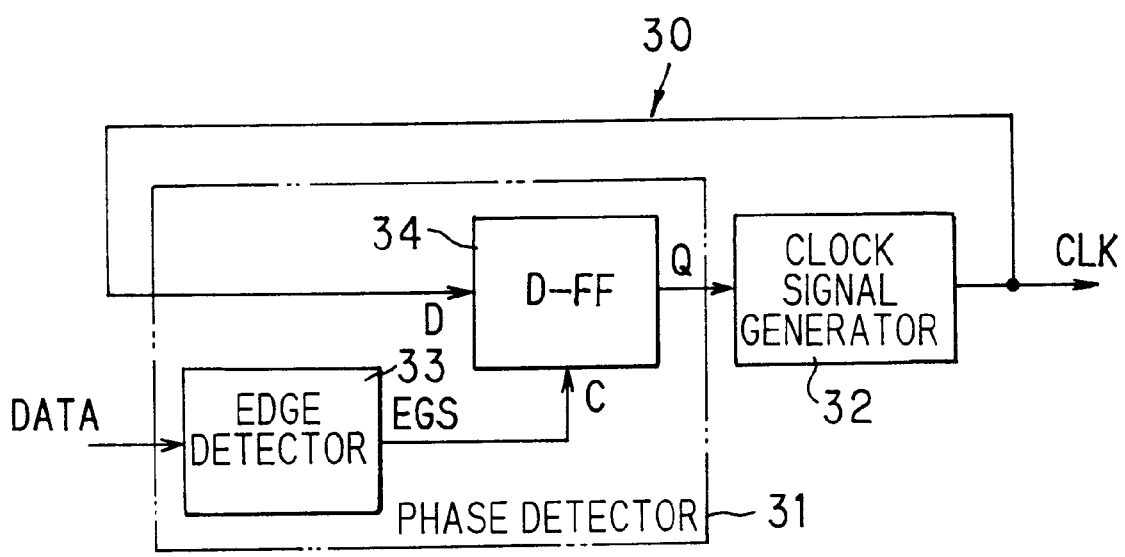
FIG. 1 is an explanatory view of the schematic structure of the present invention.

FIGS. 1 and 2 are schematic explanatory views of the present invention.

Figure 2A:
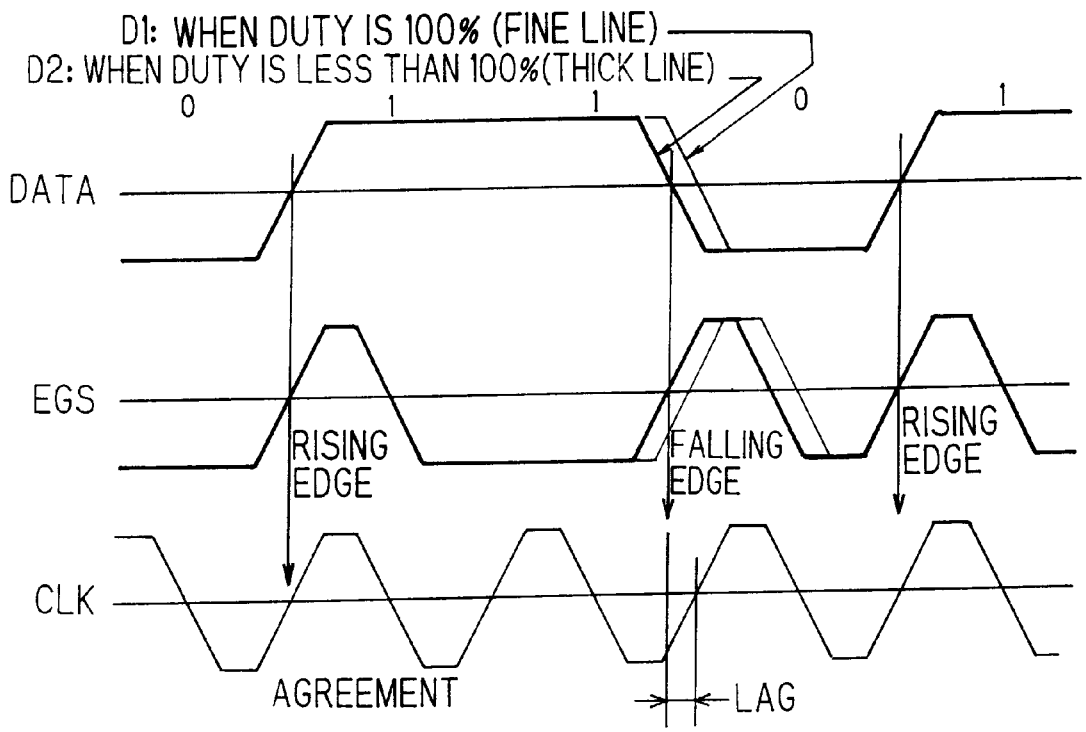
FIG. 2A and FIG. 2B show waveforms for schematically explaining the present invention.
Figure 2B:
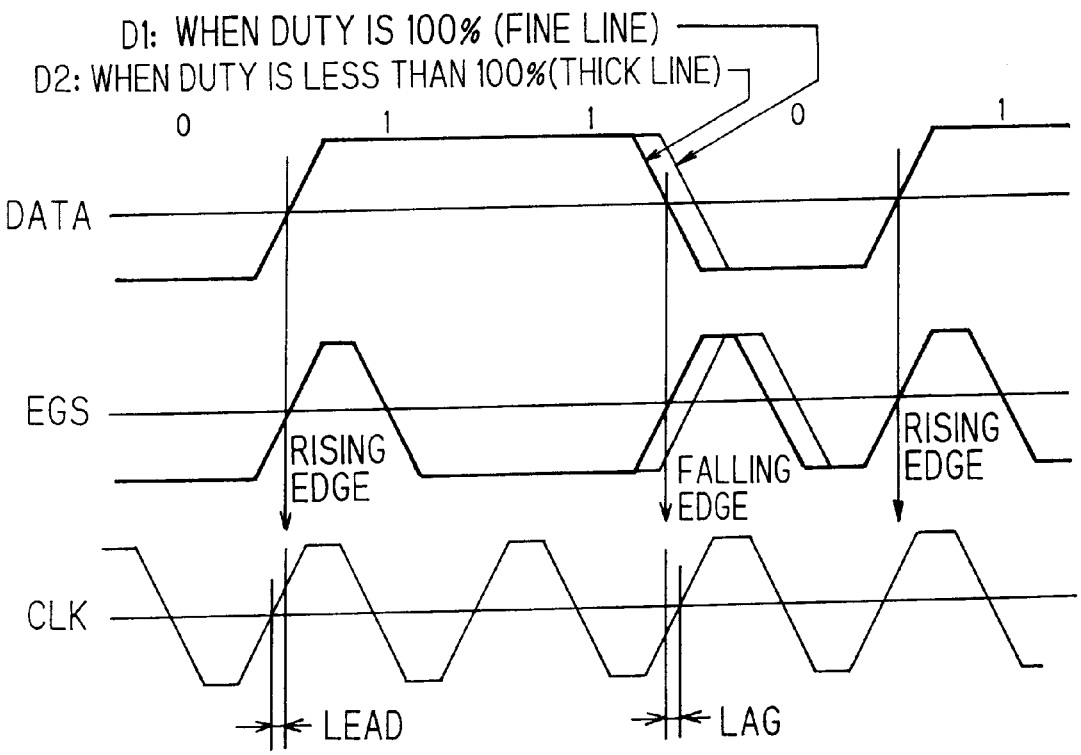

In FIG. 1, the reference numeral 30 represents a PLL circuit as a timing extracting circuit, 31 a phase detector for detecting the phase difference between a clock signal CLK and a data signal DATA, and 32 a clock signal generator for generating a clock signal so that the phase difference is optimal. In the phase detector 31, the reference numeral 33 denotes an edge detector for detecting a rising edge and a falling edge of the data signal DATA and outputting edge detection signals EGS, 34 a D flip flop (D-FF) which is provided with a clock input terminal (C terminal) to which a first signal is input, a data input terminal to which a second signal is input and an output terminal (Q terminal) for outputting a stored logical value, and which stores and outputs the logical value of the second signal in the instant of a rising edge of the first signal and holds the logical signal until the rising edge of the next first signal. The edge signal EGS is input to the clock input terminal (C terminal) as the first signal, the clock signal CLK is input to the data input terminal (D terminal) of the D-FF as the second signal, and a signal corresponding to the phase difference between the data signal DATA and the clock signal CLK is output from the output terminal of the D-FF. In FIGS. 2A and 2B, the symbol DATA represents the waveform of a data signal, EGS the waveform of an edge signal, and CLK the waveform of a clock signal.

Figure 24:
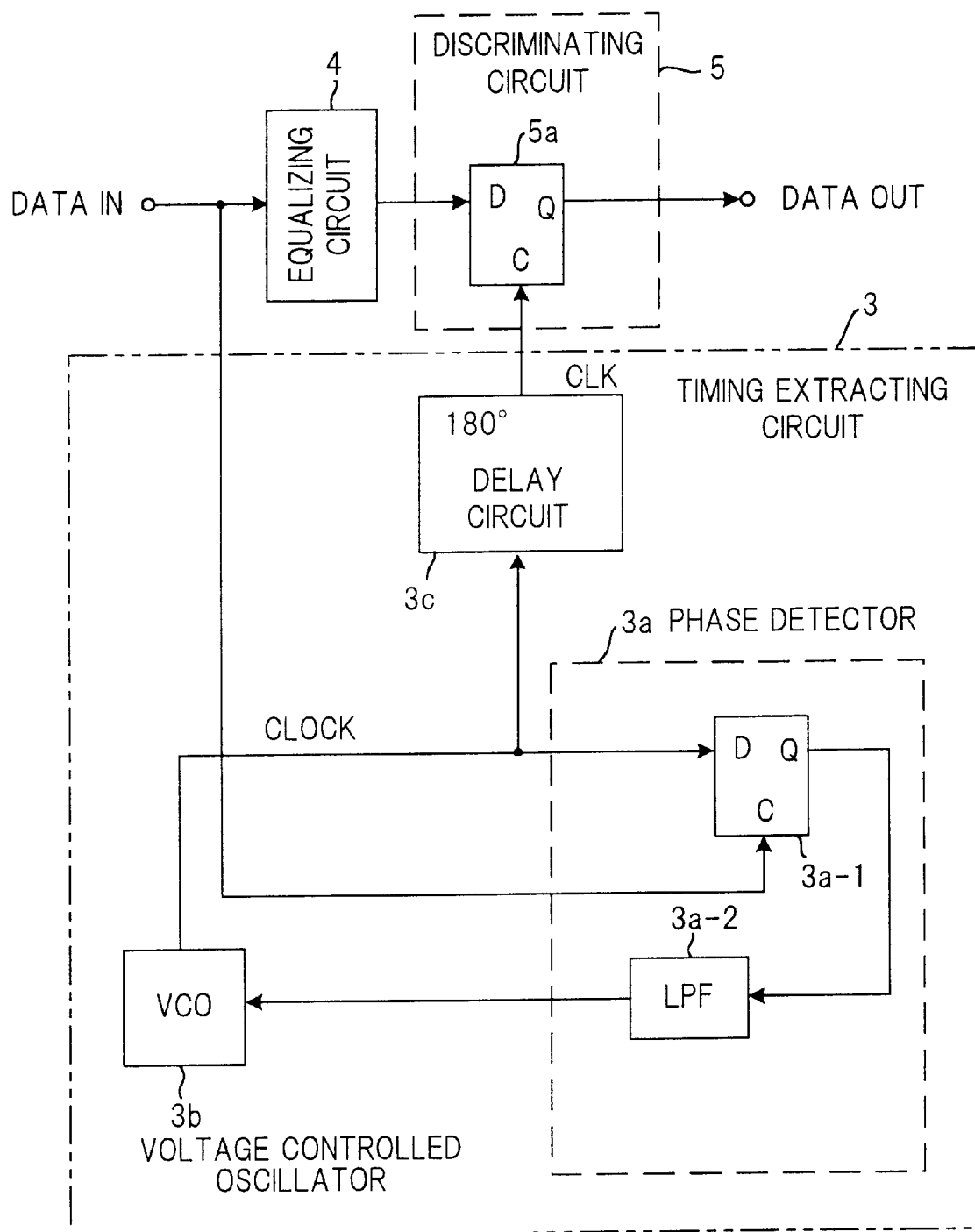
FIG. 24 shows the structure of a conventional timing extracting circuit.

If the duty of the data signal DATA is 100% (see D1 in FIG. 2A), the positions of the rising edge and the falling edge of the data signal DATA are the same with respect to the clock signal CLK. Therefore, the timing extracting circuit executes the same operation as a phase detector having no edge detector 33 (see FIG. 24).

On the other hand, the duty of the data signal is less than 100%, and the rising edge of the data signal DATA agrees with the rising edge of the clock signal CLK, the phase of the clock signal CLK appears to lag behind the falling edge of the data signal DATA (see D2 in FIG. 2A). Since the D-FF 34 outputs the average of phase differences between the clock signal CLK and the data signal DATA at both the rising edge and the falling edge, the phase of the clock signal CLK appears to lag behind the data signal as a whole. Therefore, in order to advance the phase of the clock signal in this state, the clock signal generator 32 generates a clock signal CLK. Thereby, when the phase of the clock signal CLK leads, the phase of the clock signal CLK leads the rising edge of the data signal DATA, and the delay in the phase of the clock signal behind the falling edge of the data signal is reduced. When the lead of the phase of the clock signal CLK to the rising edge of the data signal DATA and the lag of the phase of the clock signal CLK behind the falling edge of the data signal DATA coincide with each other (see FIG. 2B), the average value output from the D-FF 34 reaches the target value (the value showing the agreement of phase). At this time, if the phase of the clock signal CLK is delayed by 180°, the rising edge of the delayed clock signal just agrees with the center of the data signal.

This operation is the case in which the duty is less than 100%. The operation when the duty exceeds 100% is the same except that the lead and lag of the phase are reversed. That is, it is possible to generate a clock signal at the center of the data signal even if the duty of the data signal is not 100%, and accurate discrimination of a data signal by the discriminating circuit is possible. In addition, since it is possible to constitute the phase detector 31 by one D-FF 34 and one edge detector 33, high-speed operation is enabled. Furthermore, the circuitry scale is small and phase adjustment is unnecessary.

The edge detector 33 may have various structures. A first example of the edge detector is provided with a delay circuit for delaying the data signal by a predetermined time, and a multiplier for multiplying the data signal and the output signal of the delay circuit so as to generate an edge signal having a pulse at the rising edge and the falling edge of the data signal.

A second example of the edge detector is provided with a delay circuit for delaying the data signal by a predetermined time, and an EXOR circuit for executing an exclusive OR of the data signal and the output signal of the delay circuit so as to generate an edge signal having a pulse at the rising edge and the falling edge of the data signal.

A third example of the edge detector is provided with a delay circuit for delaying the data signal by a predetermined time, and a mixer for mixing and multiplying the data signal and the output signal of the delay circuit so as to generate an edge signal having a pulse at the rising edge and the falling edge of the data signal.

A fourth example of the edge detector is provided with a differentiator for differentiating the data signal, and a full-wave rectifier for generating an edge signal having a pulse at the rising edge and the falling edge of the data signal by the full-wave rectification of the output signal of the differentiator. In this case, the differentiator may be composed of a stub.

(B) Phase detector (a) Structure

Figure 3:
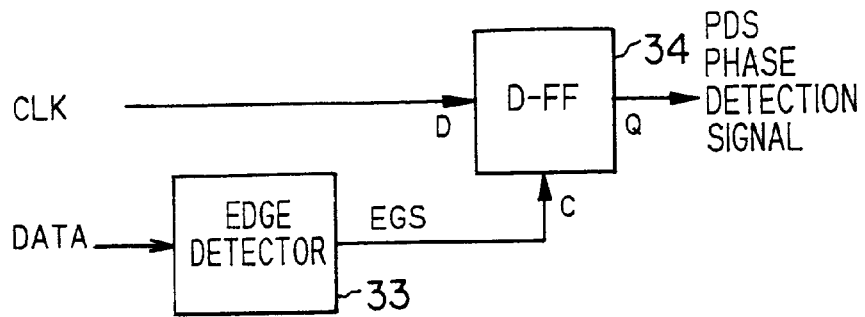
FIG. 3 shows the structure of an embodiment of a phase detector according to the present invention.

FIG. 3 shows the structure of an embodiment of a phase detector according to the present invention. The phase detector detects the phase difference between a received data signal DATA and a clock signal CLK, and it is composed of the edge detector 33 and the D flip flop (D-FF) 34. The edge detector 33 detects the rising edge and the falling edge of the data signal DATA and outputs edge signals EGS. The D flip flop (D-FF) 34 is provided with a clock input terminal (C terminal) to which a first signal is input, a data input terminal to which a second signal is input and an output terminal (Q terminal) for outputting a stored logical value. The D flip flop 34 stores and outputs the logical value of the second signal in the instant of the rising edge of the first signal and holds the logical signal until the rising edge of the next first signal.

In this embodiment, the D flip flop (D-FF) 34 inputs the edge signal EGS to the clock input terminal (C terminal) of the D-FF 34 as the first signal and the clock signal CLK to the data input terminal of the D-FF 34 as the second signal, stores the logical value ("1" or "0") of the clock signal CLK at the rising edge and the falling edge (edge signal EGS) of the data signal DATA and outputs a level corresponding to the stored logical value as a phase detection signal PDS.

Figure 25:
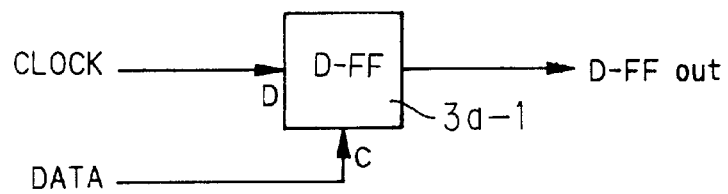
FIG. 25 is a time chart of phase detection by a D-FF.
Figure 25:
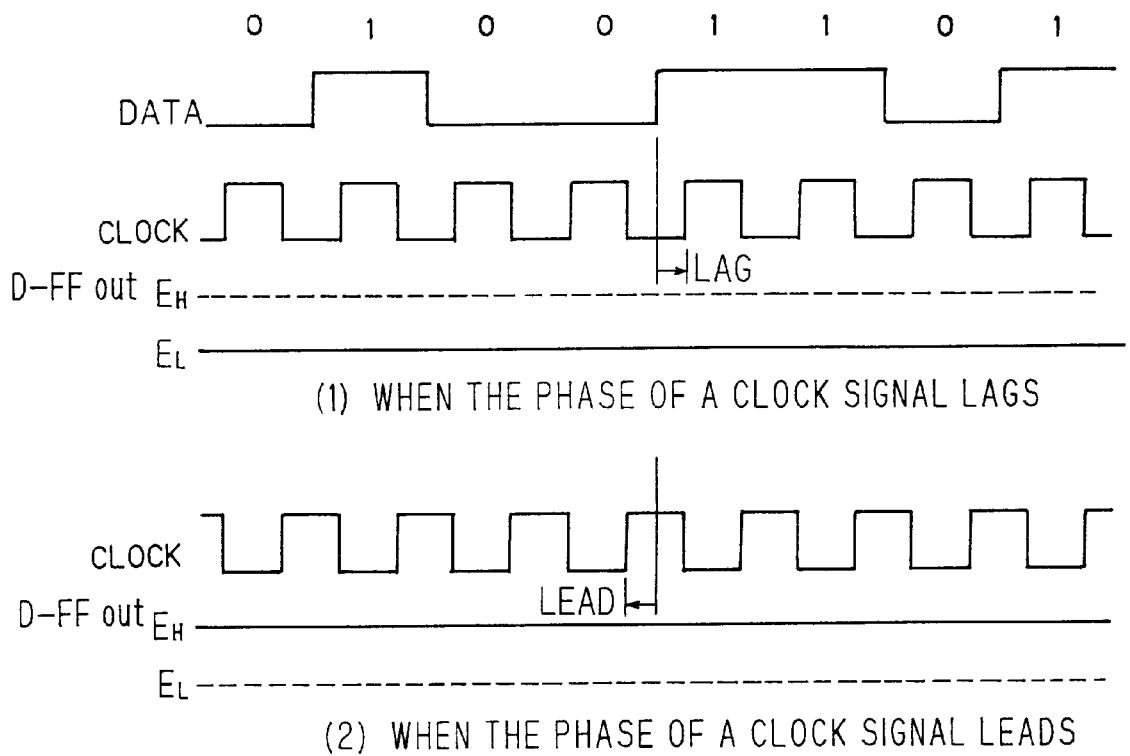
Figure 26A:
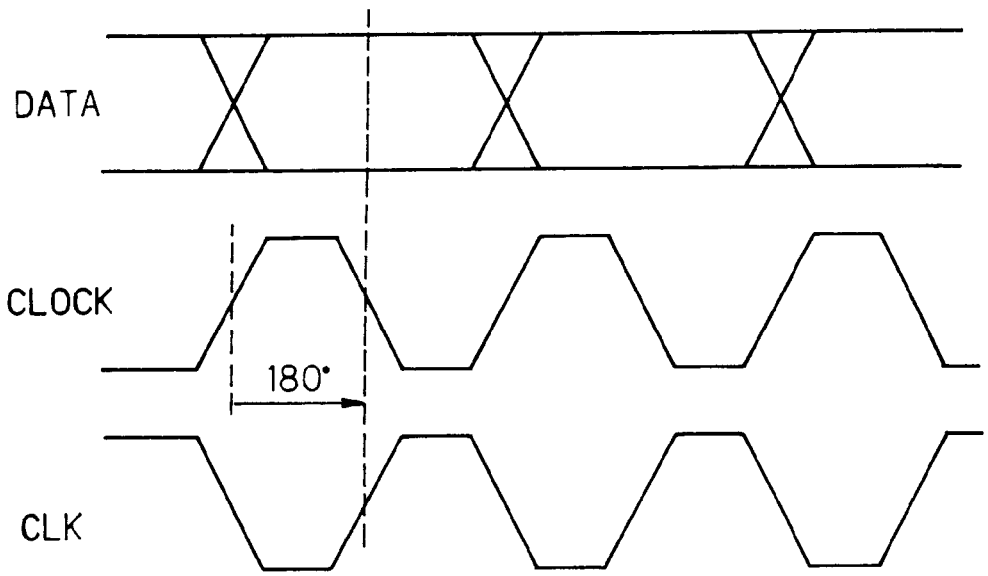
FIGS. 26A and 26B are explanatory views of phase detection by a D-FF when the duty of a data signal is 100% and when the duty is not 100%, respectively.
Figure 26B:
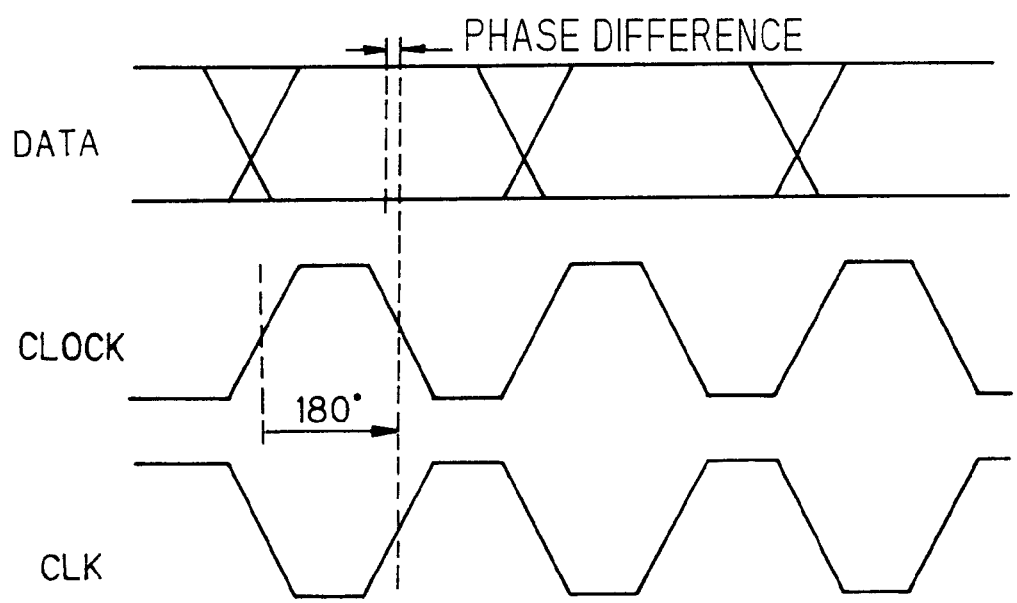
Figure 27:
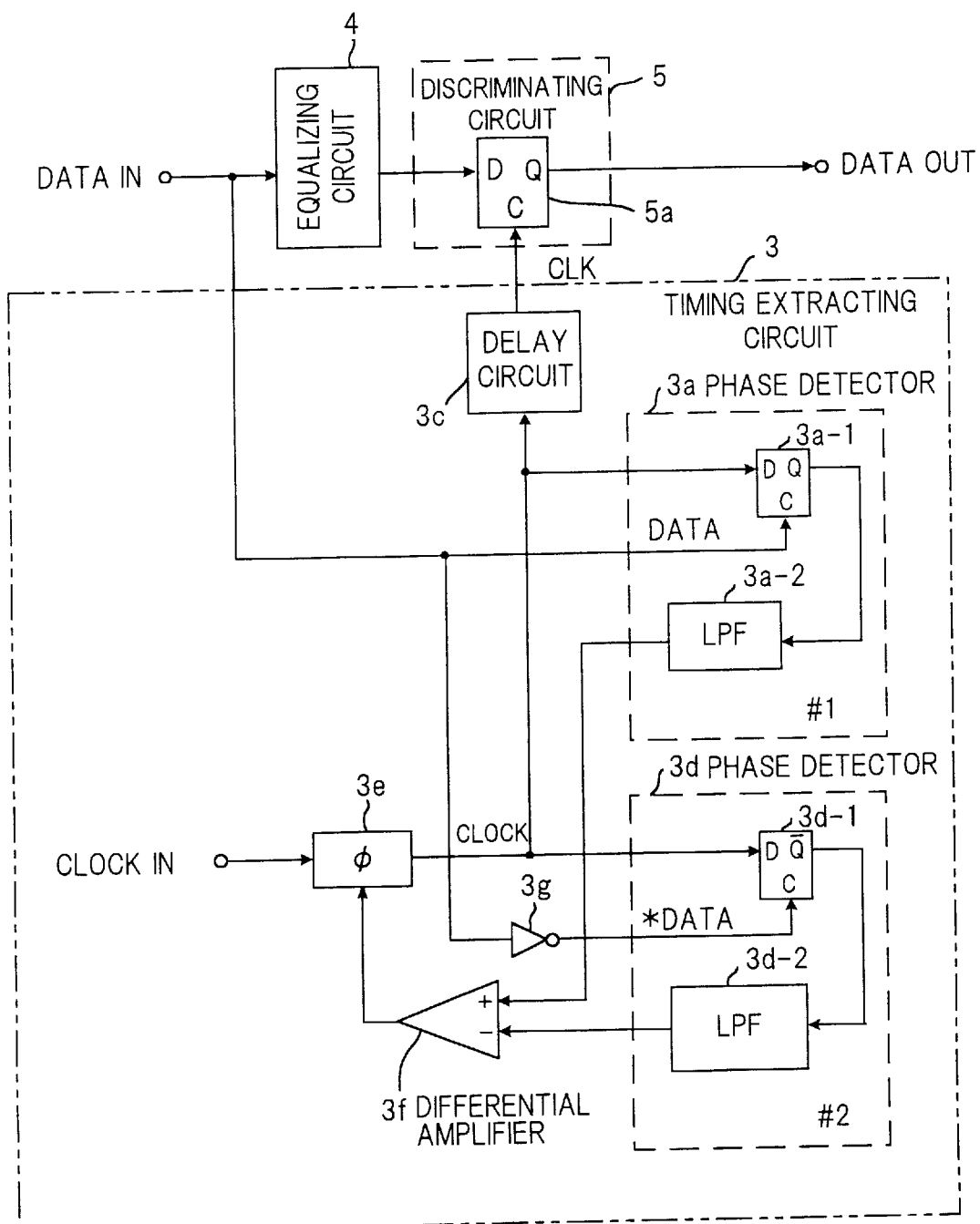
FIG. 27 shows the structure of another conventional timing extracting circuit.

When the phase of the edge signal EGS leads the phase of the clock signal CLK, the D-FF 34 outputs a phase detection signal of a low level (=$E_L$), as explained in FIG. 25(1). On the other hand, when the phase of the edge signal EGS lags behind the phase of the clock signal CLK, the D-FF 34 output a phase detection signal of a high level (=$E_H$).

(b) Phase detection when the duty is less than 100%

If the duty of a data signal is less than 100%, and the rising edge of the data signal DATA agrees with the rising edge of the clock signal CLK, the phase of the clock signal CLK lags behind the falling edge of the data signal (see FIG. 2A). In such a state, although the average value of the output of the D-FF at the rising edge of the data signal reaches a predetermined value (e.g., $E_0$), the output of the D-FF at the falling edge of the data signal has a low level (e.g., $E_L$ volt, $E_L<E_0$). The low-level period depends upon the lag of the phase, and the average level of the phase detection signal PDS takes a value corresponding to the lag of the phase.

When the phase of the clock signal CLK is advanced in this state (see FIG. 2B), the phase of the clock signal CLK leads the rising edge of the data signal DATA, and the delay in the phase of the clock signal behind the falling edge of the data signal is reduced. For this reason, the output of the D-FF at the rising edge of the data signal has a high level (e.g., $E_H$ volt, $E_H>E_0$), and the high-level period depends upon the lead of the phase. The output of the D-FF at the falling edge of the data signal has a low level $E_L$, and the low-level period depends upon the lag of the phase. Therefore, the average level of the phase detection signal PDS is a value corresponding to the difference between the value in the high-level period and the value in the low-level period. In other words, the value corresponds to the difference between the lead of the phase of the clock signal CLK to the rising edge of the data signal DATA and the lag of the phase of the clock signal CLK behind the falling edge of the data signal DATA.

When the lead of the phase of the clock signal CLK to the rising edge of the data signal DATA and the lag of the phase of the clock signal CLOCK behind the falling edge of the data signal DATA become equal, the average level of the phase detection signal PDS becomes $E_0$.

(c) Phase detection when the duty is more than 100%

If the duty of a data signal is more than 100%, and the rising edge of the data signal DATA agrees with the rising edge of the clock signal CLK, the phase of the clock signal CLK leads the falling edge of the data signal. In such a state, although the average value of the output of the D-FF at the rising edge of the data signal reaches a predetermined value (e.g., $E_0$), the output of the D-FF at the falling edge of the data signal has a high level (e.g., $E_H$ volt). The high-level period depends upon the lead of the phase, and the average level of the phase detection signal PDS takes a value corresponding to the lead of the phase.

When the phase of the clock signal CLK is delayed in this state, the phase of the clock signal CLK lags behind the rising edge of the data signal DATA, and the lead of the phase of the clock signal to the falling edge of the data signal is reduced. For this reason, the output of the D-FF at the rising edge of the data signal has a low level (e.g., $E_L$ volt), and the low-level period depends upon the lag of the phase. The output of the D-FF at the falling edge of the data signal has a high level $E_H$, and the high-level period depends upon the lead of the phase. Therefore, the average level of the phase detection signal PDS is a value corresponding to the difference between the value in the high-level period and the value in the low-level period. In other words, the value corresponds to the difference between the lag of the phase of the clock signal CLK behind the rising edge of the data signal DATA and the lead of the phase of the clock signal CLK to the falling edge of the data signal DATA.

When the lag of the phase of the clock signal CLK behind the rising edge of the data signal DATA and the lead of the phase of the clock signal CLK to the falling edge of the data signal DATA become equal, the average level of the phase detection signal PDS becomes $E_0$.

In this manner, according to the phase detector shown in FIG. 3, it is possible to detect clock phases at both the rising edge and the falling edge of the data signal by one D-FF 34 and to output a signal having a value corresponding to the average value of the outputs of the respective clock phases.

In order that the average of the lead of the phase of the clock signal to the rising edge of the data signal and the lag of the phase behind the falling edge of the data signal agrees with the phase of the data signal, the probability of generating a rising edge and the probability of generating a falling edge must be equal. In an optical communication system, since a signal being transmitted is scrambled, it is considered to be almost random and having a mark ratio of 1/2. At this time, the probability of generating a rising edge and the probability of generating a falling edge on the border between bits is 1/4. If the mark ratio is assumed to be m, the probability of generating each edge is m(1−m). Accordingly, if the average value of the deviation of the phase at each edge is used, it is possible to hold the phase relationship between the clock signal and the data signal constant.

(d) First example of the edge detector

Figure 4:
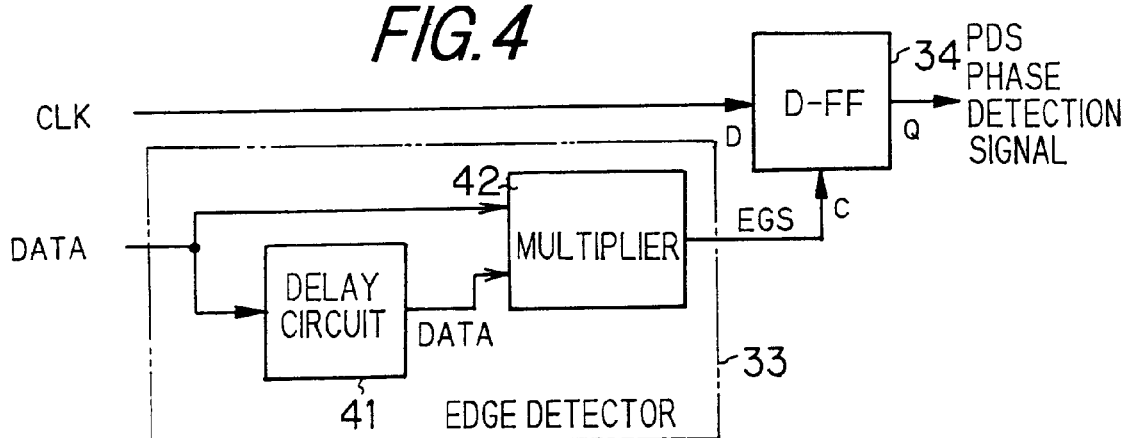
FIG. 4 shows a first example of an edge detector in the phase detector shown in FIG. 3.
Figure 5:
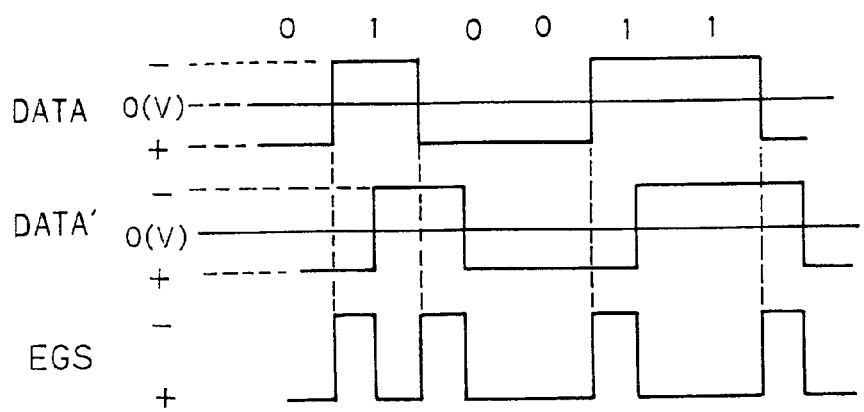
FIG. 5 shows the waveforms of the operation of the edge detector shown in FIG. 4.

FIG. 4 shows the structure of a first example of the edge detector, and FIG. 5 shows the waveforms of the operation thereof. In FIG. 4, the reference numeral 33 represents an edge detector, and 34 a D flip flop (D-FF). Although the data signal DATA has a rectangular waveform in FIG. 5, it is actually distorted during transmission due to the influence of noise or the like.

In the edge detector 33, the reference numeral 41 denotes a delay circuit for delaying the data signal DATA by a predetermined time, and 42 a multiplier for multiplying the data signal DATA and the output signal DATA' of the delay circuit 41 and generating an edge signal EGS having a pulse at the rising edge and the falling edge. As shown in FIG. 5, if it is assumed that the level "0" is + and the level "1" is −, when the logical values of DATA and DATA' are the same, the product becomes +, while when they are different, the product becomes −. Since the logical value of the data signal DATA is different only at the rising edge and the falling edge, the edge signal EGS which rises at the rising edge and the falling edge of the data signal is generated, as shown in FIG. 5.

(e) Second example of the edge detector

Figure 6:
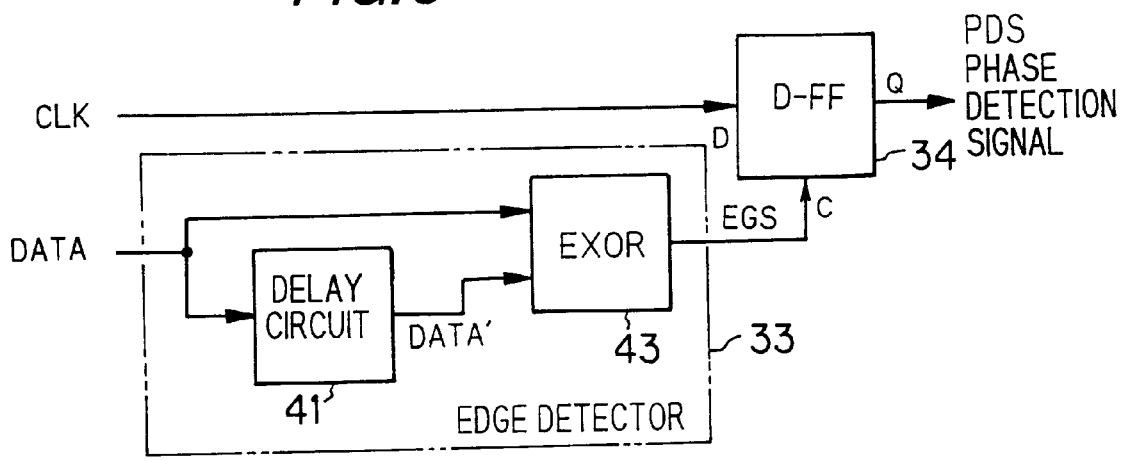
FIG. 6 shows a second example of an edge detector in the phase detector shown in FIG. 3.
Figure 7:
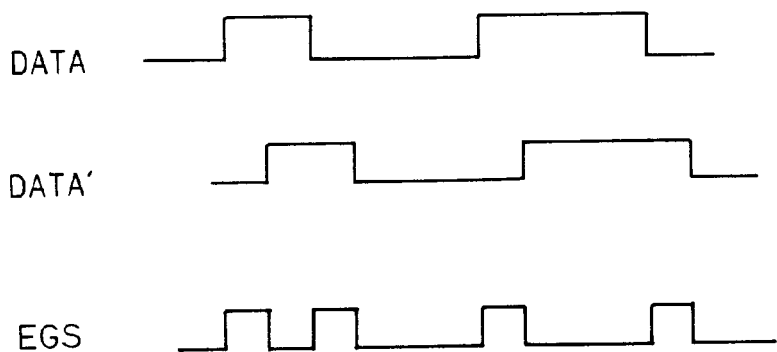
FIG. 7 shows the waveforms of the operation of the edge detector shown in FIG. 6.

FIG. 6 shows the structure of a second example of the edge detector, and FIG. 7 shows the waveforms of the operation thereof. In FIG. 6, the reference numeral 33 represents an edge detector, and 34 a D flip flop (D-FF).

In the edge detector 33, the reference numeral 41 denotes a delay circuit for delaying the data signal DATA by a predetermined time, and 43 an EXOR circuit (exclusive OR gate) for executing an exclusive OR of the data signal DATA and the output signal DATA' of the delay circuit 41 so as to generate an edge signal EGS having a pulse at the rising edge and the falling edge of the data signal. Since the logical value of the data signal DATA is different only at the rising edge and at the falling edge, the edge signal EGS which rises at the rising edge and the falling edge of the data signal is output from the EXOR circuit 43, as shown in FIG. 7.

(f) Third example of the edge detector

Figure 8:
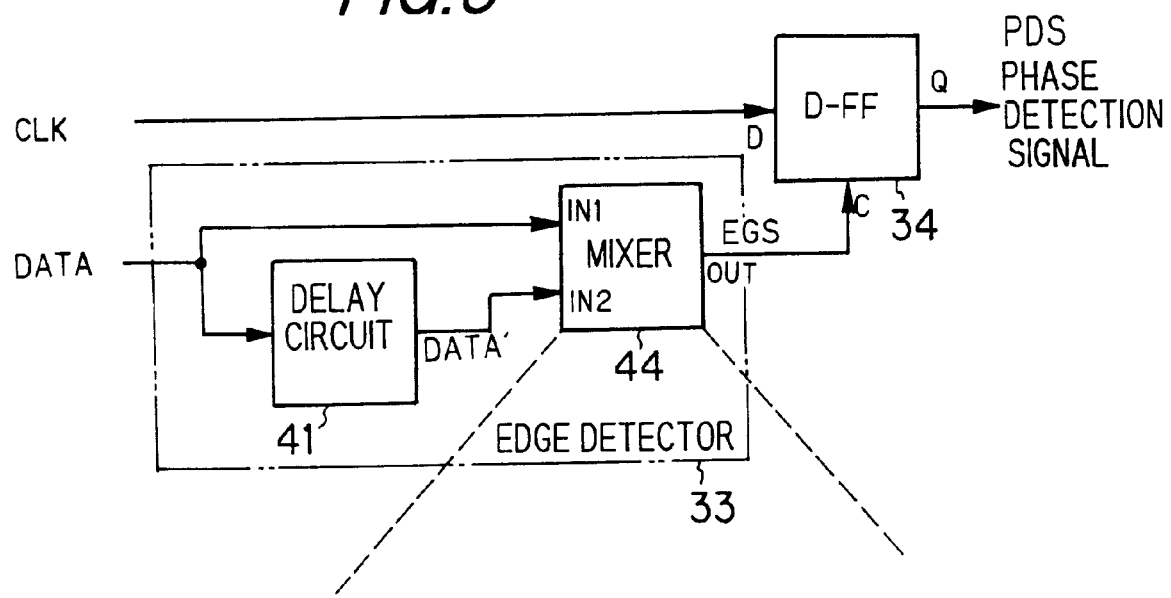
FIG. 8 shows a third example of an edge detector in the phase detector shown in FIG. 3.
Figure 9:
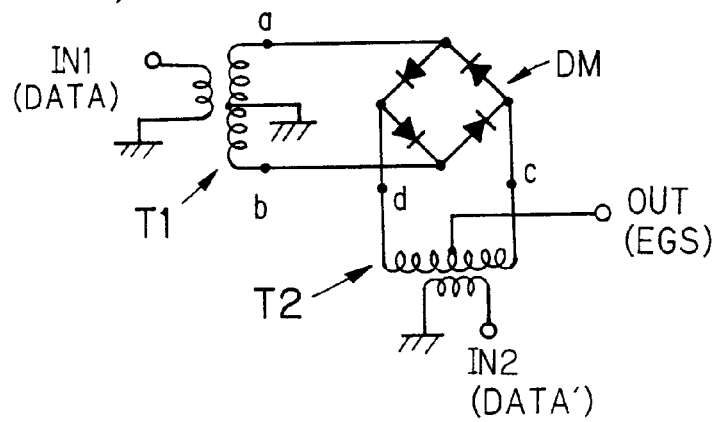
FIG. 9 shows a logical diagram for a mixer of the edge detector shown in FIG. 8.

FIG. 8 shows the structure of a second example of the edge detector, and FIG. 9 shows the logical table of a mixer. In FIG. 8, the reference numeral 33 represents an edge detector, and 34 a D flip flop (D-FF).

In the edge detector 33, the reference numeral 41 denotes a delay circuit for delaying the data signal DATA by a predetermined time, and 44 a DBM (double-balanced mixer) for multiplying two input signals DATA and DATA' and outputting the product. The double-balanced mixer includes a first coupling transformer T1 to the primary coil of which a first signal IN1 (e.g., data signal DATA) is input and the intermediate tap of the secondary coil of which is grounded, a second coupling transformer T2 to the primary coil of which a second signal IN2 (e.g., delayed data signal DATA') is input and from the intermediate tap of the secondary coil of which an output signal is taken out, and a diode portion DM composed of four diodes which are connected in a loop with the polarities shown in FIG. 8, and to a first diagonal position and to a second diagonal position of which are connected the secondary coil of the first coupling transformer T1 and the secondary coil of the second coupling transformer T2, respectively.

In the DBM (double-balanced mixer), each portion exhibits the polarity in the logical table shown in FIG. 9 in correspondence with the polarities of the first and second signals IN1 and IN2, and a signal OUT having a polarity of the product of the first and second signals IN1 and IN2 is output from the output terminal. In this manner, since the DBM (double-balanced mixer) has a multiplication function, when the data signal DATA and the delayed data signal DATA' are input as the first and second signals IN1, IN2, the edge signal EGS which rises at the rising edge and the falling edge of the data signal DATA is generated in the same way as in the edge detector shown in FIG. 4.

(g) Fourth example of the edge detector

Figure 10:
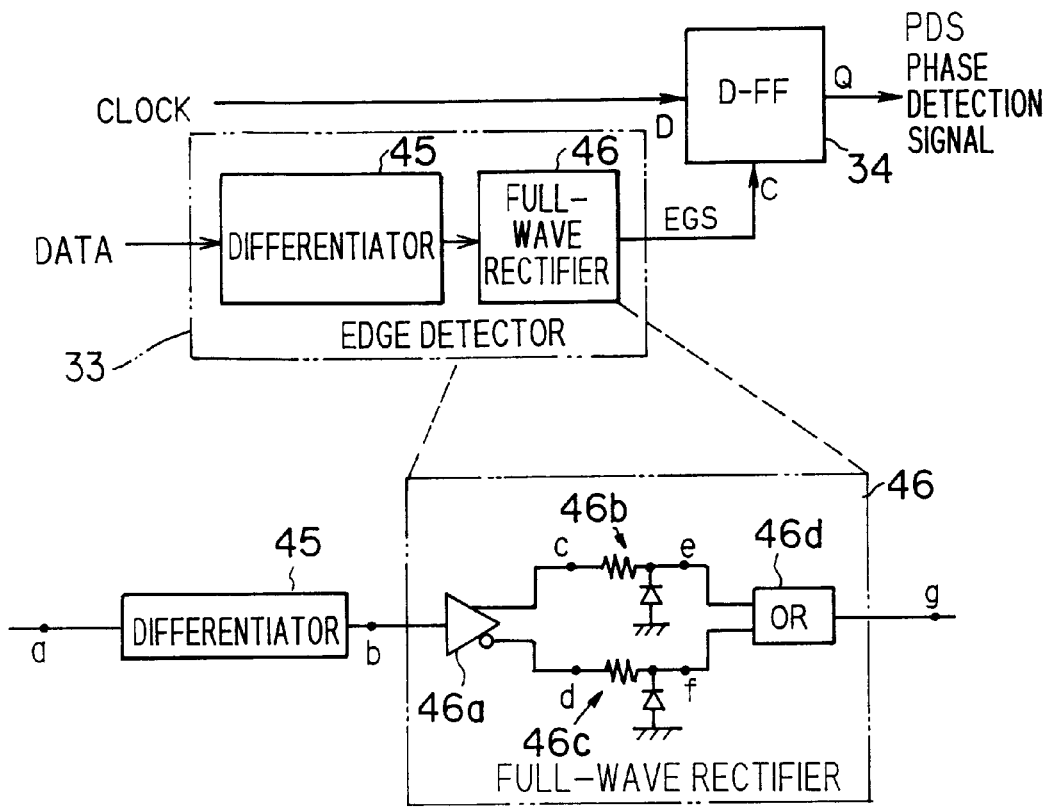
FIG. 10 shows a fourth example of an edge detector in the phase detector shown in FIG. 3.
Figure 11:
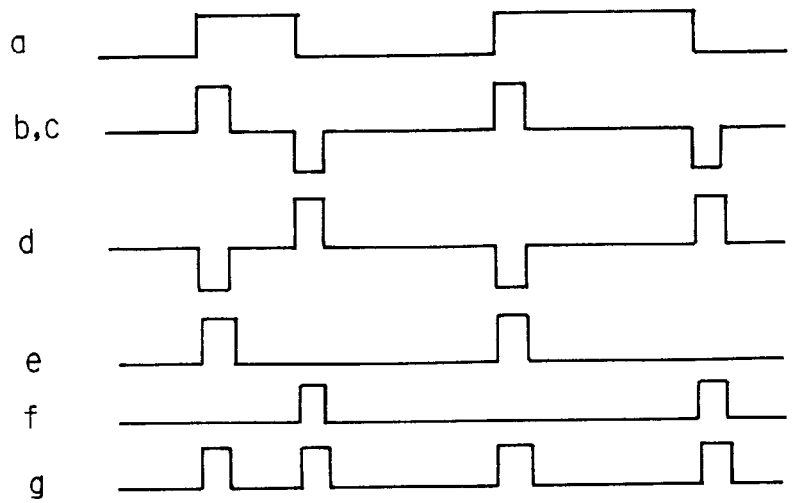
FIG. 11 shows the waveforms of the operation of the edge detector shown in FIG. 10.

FIG. 10 shows the structure of a fourth example of the edge detector, and FIG. 11 shows the waveforms of the operation thereof. In FIG. 10, the reference numeral 33 represents an edge detector, and 34 a D flip flop (D-FF).

In the edge detector 33, the reference numeral 45 denotes a differentiator for differentiating the data signal DATA and generating a positive pulse at the rising edge and a negative pulse at the falling edge, and 46 a full-wave rectifier for generating an edge signal EGS which rises at the rising edge and the falling edge of the data signal DATA by the full-wave rectification of the output signal of the differentiator.

The full-wave rectifier 46 includes a gate 46a for outputting the non-inverting signal and the inverting signal of an input signal, first and second half-wave rectifiers 46b, 46c each of which is composed of a resistor and a diode, and an OR gate 46d for synthesizing the outputs of the first and second half-wave rectifiers 46b, 46c.

The input and output signals a, b, and the signals c to f at the portions c to f of the full-wave rectifier 46 and the output signal g thereof have the waveforms shown in FIG. 11. The output signal g constitutes the edge signal EGS which rises at the rising edge and the falling edge, respectively, of the input signal a. That is, it is possible to generate the edge signal EGS which rises at the rising edge and the falling edge, respectively, of data signal DATA by the edge detector 33 shown in FIG. 10.

Figure 12:
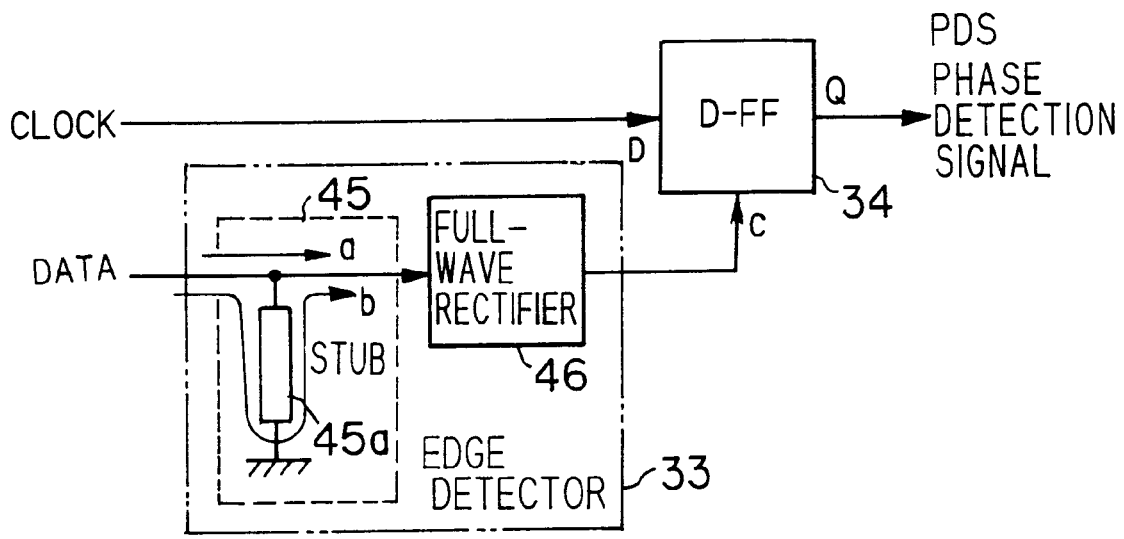
FIG. 12 is a modification of the fourth example of the edge detector shown in FIG. 10, in which a differentiator is composed of a stub.
Figure 13:
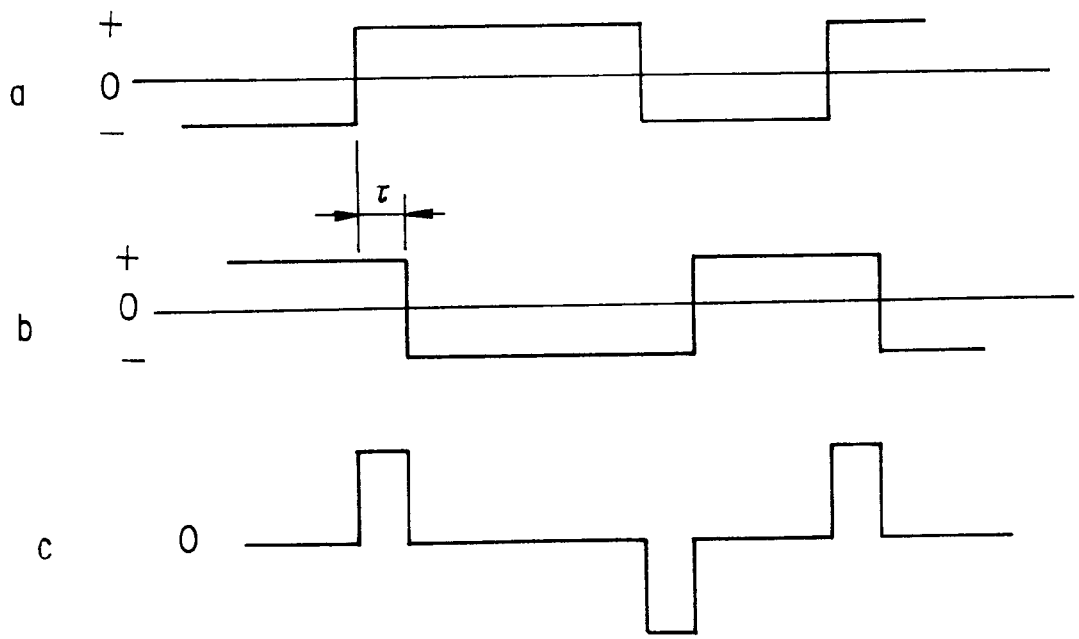
FIG. 13 shows the waveforms of the operation of the edge detector shown in FIG. 12.

FIG. 12 shows a modification of the fourth example of the edge detector. In this modification, the differentiator 45 is composed of a stub. In FIG. 12, the reference numeral 45a represents a stub. The stub 45a is a transmission line having a branched line whose termination is short-circuited, and constitutes a differentiator when it is connected in such a manner as shown in FIG. 12. A data signal a of 10 Gbps transmitted on the stub 45a from one end is reflected by the other end and returns as a delayed data signal b. The delay time of the signal b can be adjusted by the length of the stub 45a. It is therefore possible to synthesize the signals a and b in the form of c, and obtain a differentiated signal by setting the length of the stub 45a so that the delay time $\tau$ shown in FIG. 13 may be obtained.

(C) Timing extracting circuit (a) Structure

Figure 14:
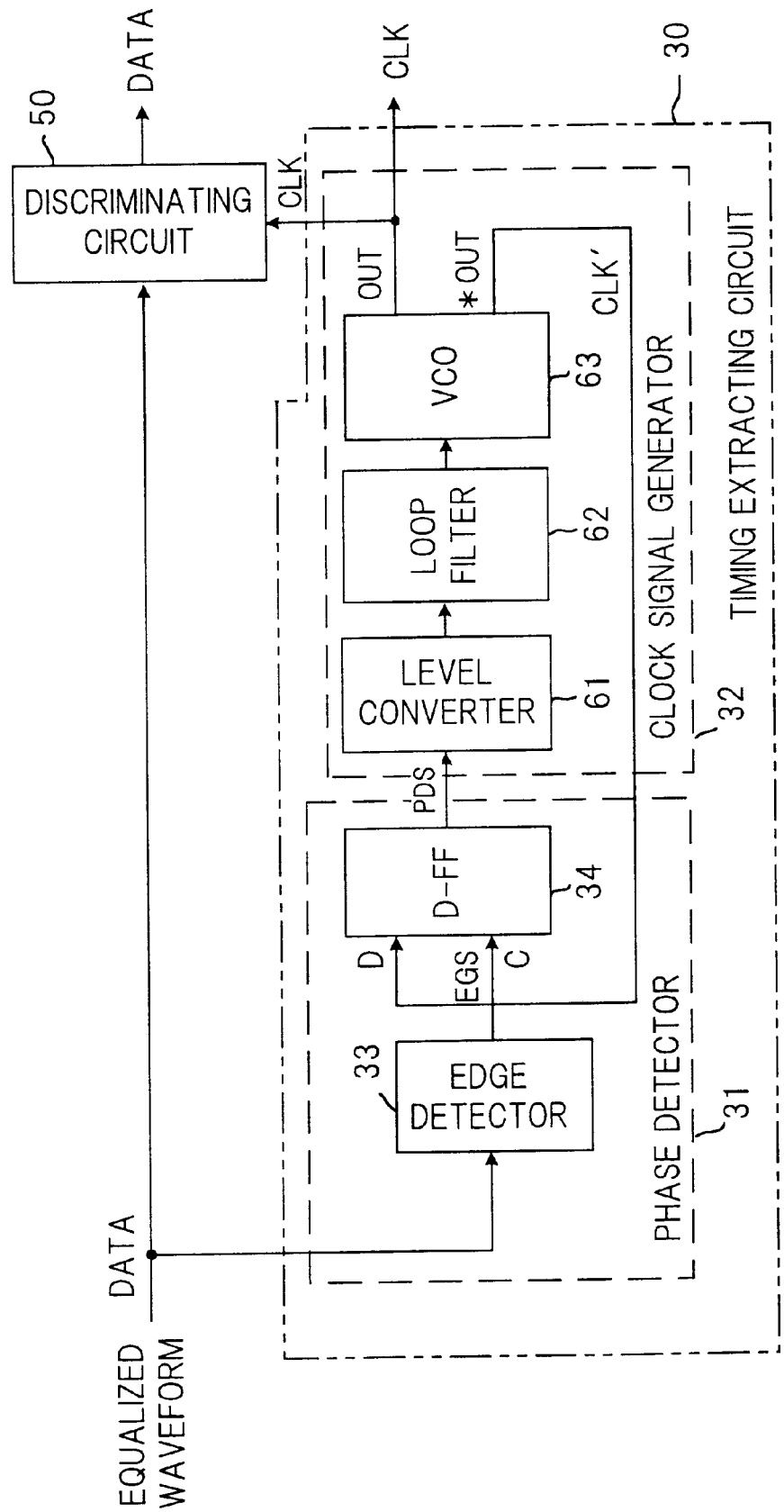
FIG. 14 shows the structure of an embodiment of a timing extracting circuit according to the present invention.

FIG. 14 shows the structure of an embodiment of a timing extracting circuit according to the present invention which is usable for an optical receiver. In FIG. 14, the reference numeral 30 represents a timing extracting circuit and 50 a discriminating circuit. To the timing extracting circuit 30 a data signal DATA having an equalized waveform is input from an equalizing circuit (not shown), and the timing extracting circuit 30 generates a clock signal CLK which indicates the timing for discriminating data. The timing extracting circuit 30 has a PLL structure provided with a phase detector 31 and a clock signal generator 32. The discriminating circuit 50 discriminates and outputs the data signal DATA at the timing at which the clock signal CLOCK is generated.

The phase detector 31 has the same structure as the phase detector shown in FIG. 3. That is, the phase detector 31 is provided with an edge detector 33 and a D flip flop (D-FF) 34, and outputs a phase detection signal PDS which corresponds to the sum of the phase of the clock signal CLK' to the rising edge of the data signal DATA and the phase of the clock signal CLK' to the falling edge of the data signal DATA. Therefore, if the summed phase is a leading phase, the phase detector 31 outputs a phase detection signal PDS of a level $E_H$, while if the summed phase is a lagging phase, the phase detector 31 outputs a phase detection signal PDS of a level $E_L$ ($<E_H$).

The clock signal generator 32 includes a level converter 60 for converting the level of the phase detection signal PDS input thereto, a loop filter 62 for smoothing the output signal of the level converter 61, and a voltage controlled oscillator (VCO) for generating a clock signal CLK having a frequency corresponding to the output of the loop filter 62 and a clock signal CLK' obtained by delaying the clock signal CLK by 180°. The clock signal generator 32 feeds back the clock signal CLK' to the DATA input terminal of the D-FF 34 of the phase detector 31.

(b) Operation

The phase detector 31 outputs a phase detection signal PDS which corresponds to the sum of the phase of the clock signal CLK' to the rising edge of the data signal DATA and the phase of the clock signal CLK' to the falling edge of the data signal DATA, and the clock signal generator 32 generates a clock signal CLK so that the summed phase becomes zero and feeds back the clock signal CLK' to the phase detector 31. By this feedback control, the lag (or lead) of the phase of the clock signal CLK' to the rising edge of the data signal DATA finally becomes equal to the lead (or lag) of the phase of the clock signal CLK' to the falling edge of the data signal DATA, so that the level of the phase detection signal PDS reaches $E_0$. At this time the clock CLK generates at the center of the data signal DATA.

That is, it is possible to generate a clock signal CLK at the center of the data signal DATA and accurately discriminate the data signal even if the duty of the data signal DATA is not 100%.

(c) First modification

Figure 15:
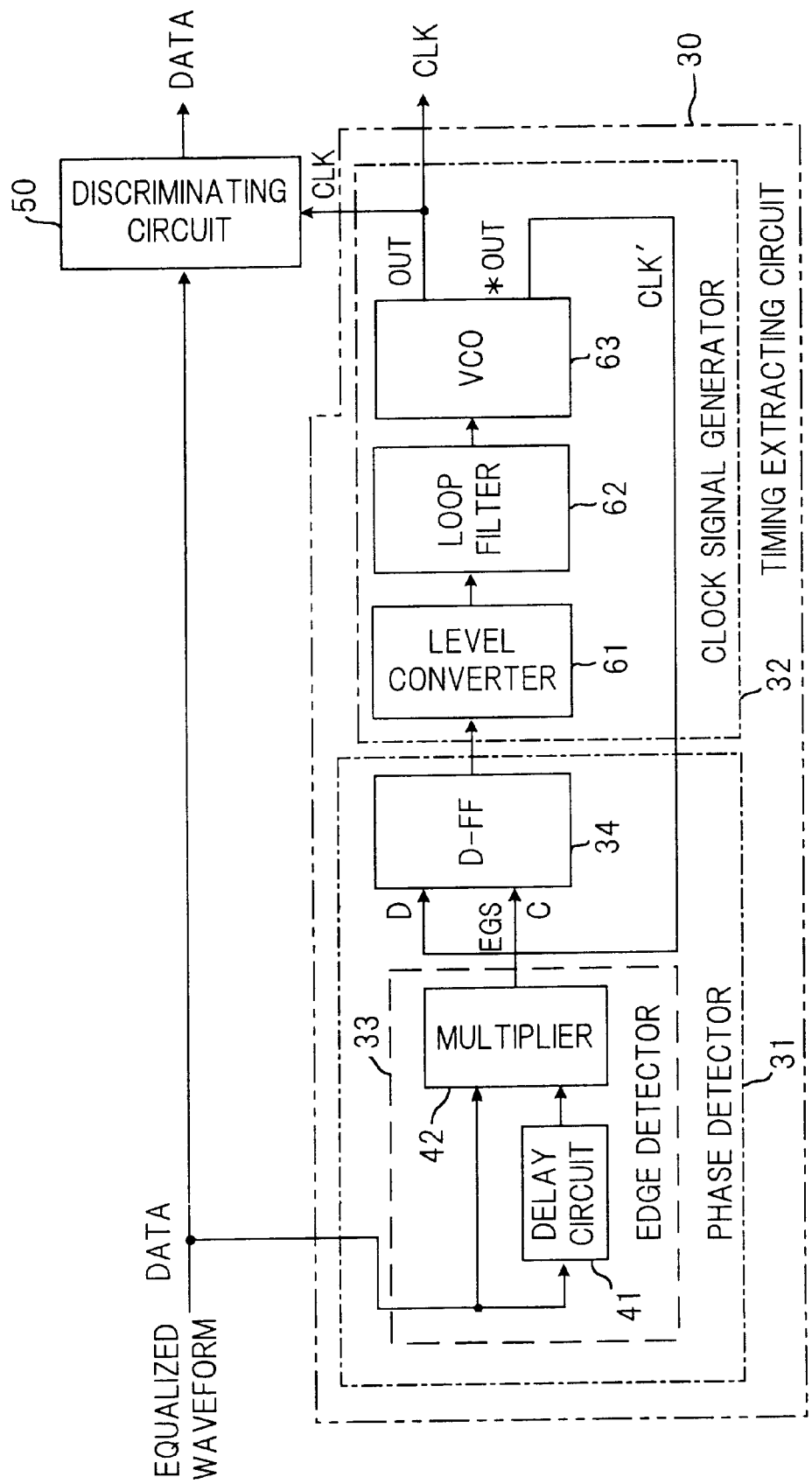
FIG. 15 shows a first modification of the embodiment of a timing extracting circuit according to the present invention shown in FIG. 14.

FIG. 15 shows a first modification of the timing extracting circuit. The same reference numerals are provided for the elements which are the same as those shown in FIG. 14. In the first modification, the edge detector 33 is constituted by the edge detector shown in FIG. 4. In FIG. 15, the reference numeral 41 represents a delay circuit for delaying a data signal DATA by a predetermined time and 42 a multiplier for multiplying the data signal DATA and the output signal DATA' of the delay circuit 41 and generating an edge signal EGS having a pulse at the rising edge and the falling edge.

(d) Second modification

Figure 16:
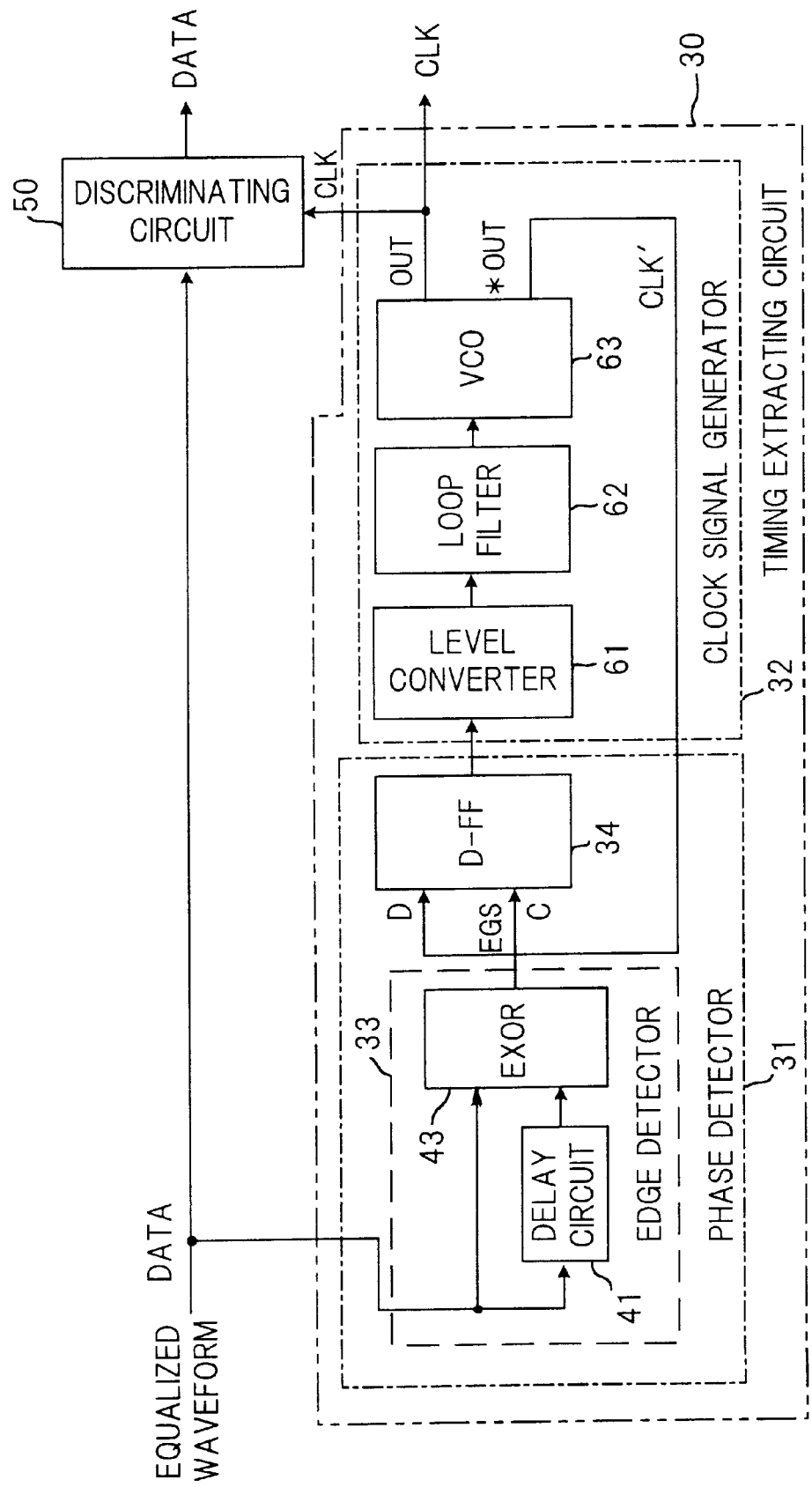
FIG. 16 shows a second modification of the embodiment of a timing extracting circuit shown in FIG. 14.

FIG. 16 shows a second modification of the timing extracting circuit. The same reference numerals are provided for the elements which are the same as those shown in FIG. 14. In the second modification, the edge detector 33 is constituted by the edge detector shown in FIG. 6. In FIG. 16, the reference numeral 41 denotes a delay circuit for delaying the data signal DATA by a predetermined time, and 43 an EXOR circuit for executing an exclusive OR of the data signal DATA and the output signal DATA' of the delay circuit 41 so as to generate an edge signal EGS having a pulse at the rising edge and the falling edge of the data signal.

(e) Third modification

Figure 17:
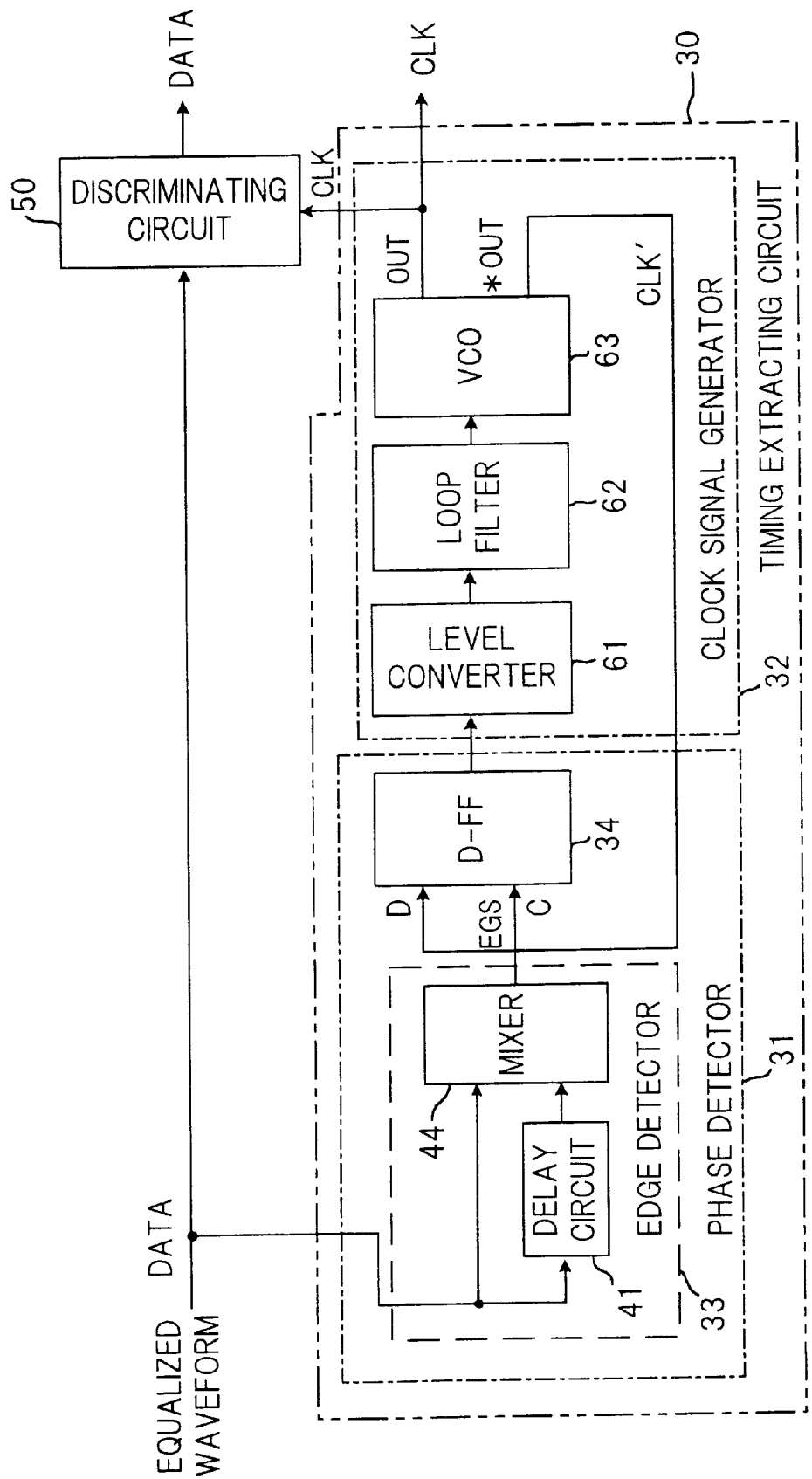
FIG. 17 shows a third modification of the embodiment of a timing extracting circuit shown in FIG. 14.

FIG. 17 shows a third modification of the timing extracting circuit. The same reference numerals are provided for the elements which are the same as those shown in FIG. 14. In the third modification, the edge detector 33 is constituted by the edge detector shown in FIG. 8. In FIG. 17, the reference numeral 41 denotes a delay circuit for delaying the data signal DATA by a predetermined time, and 44 a mixer for mixing and multiplying the data signal DATA and the output signal of the delay circuit 41 and outputting an edge signal EGS which rises at the rising edge and the falling edge of the data signal.

(f) Fourth modification

Figure 18:
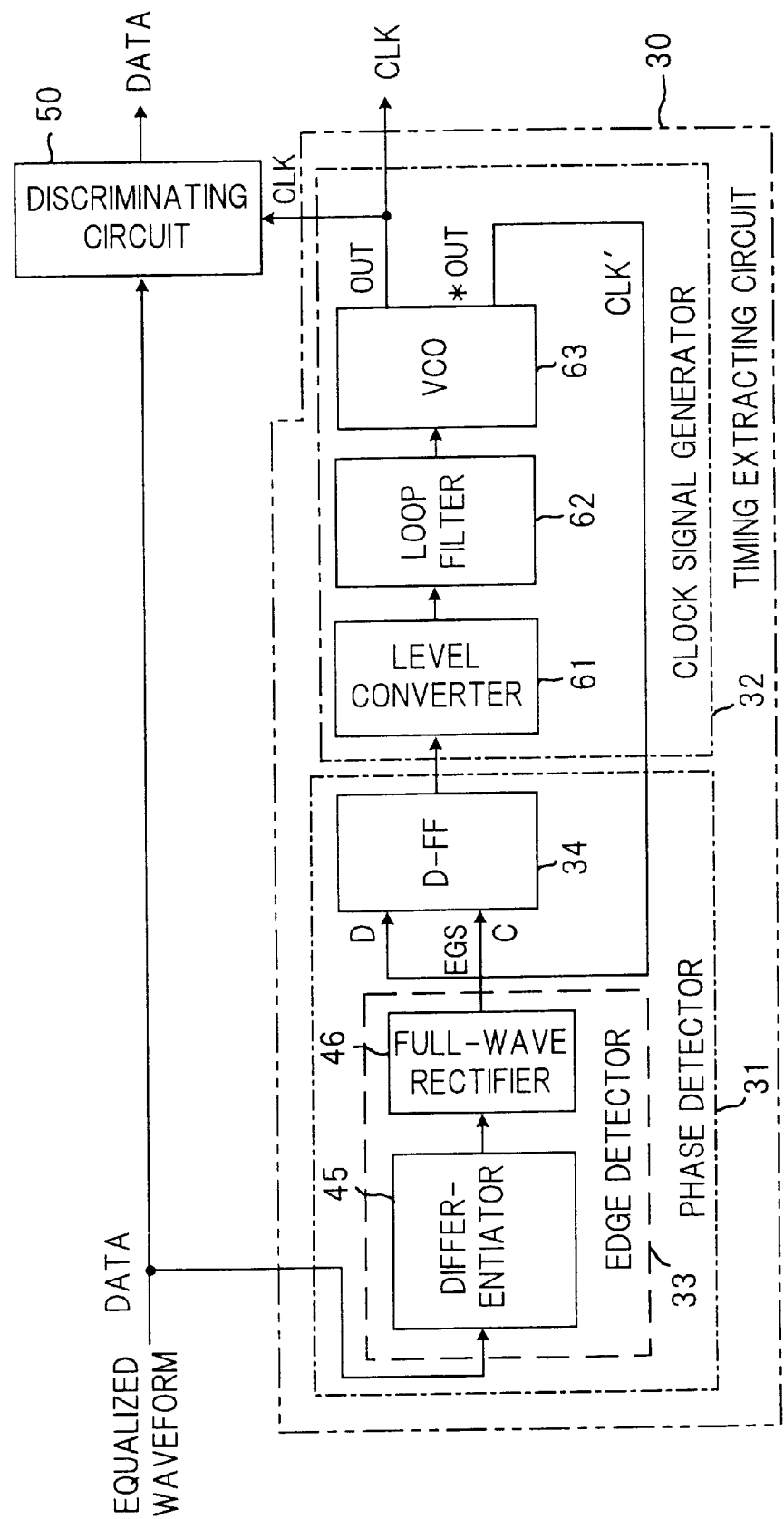
FIG. 18 shows a fourth modification of the embodiment of a timing extracting circuit shown in FIG. 14.

FIG. 18 shows a fourth modification of the timing extracting circuit. The same reference numerals are provided for the elements which are the same as those shown in FIG. 14. In the fourth modification, the edge detector 33 is constituted by the edge detector shown in FIG. 10. In FIG. 18, the reference numeral 45 denotes a differentiator for differentiating the data signal DATA, and 46 a full-wave rectifier for generating an edge signal EGS which rises at the rising edge and the falling edge of the data signal DATA by the full-wave rectification of the output signal of the differentiator.

(g) Fifth modification

Figure 19:
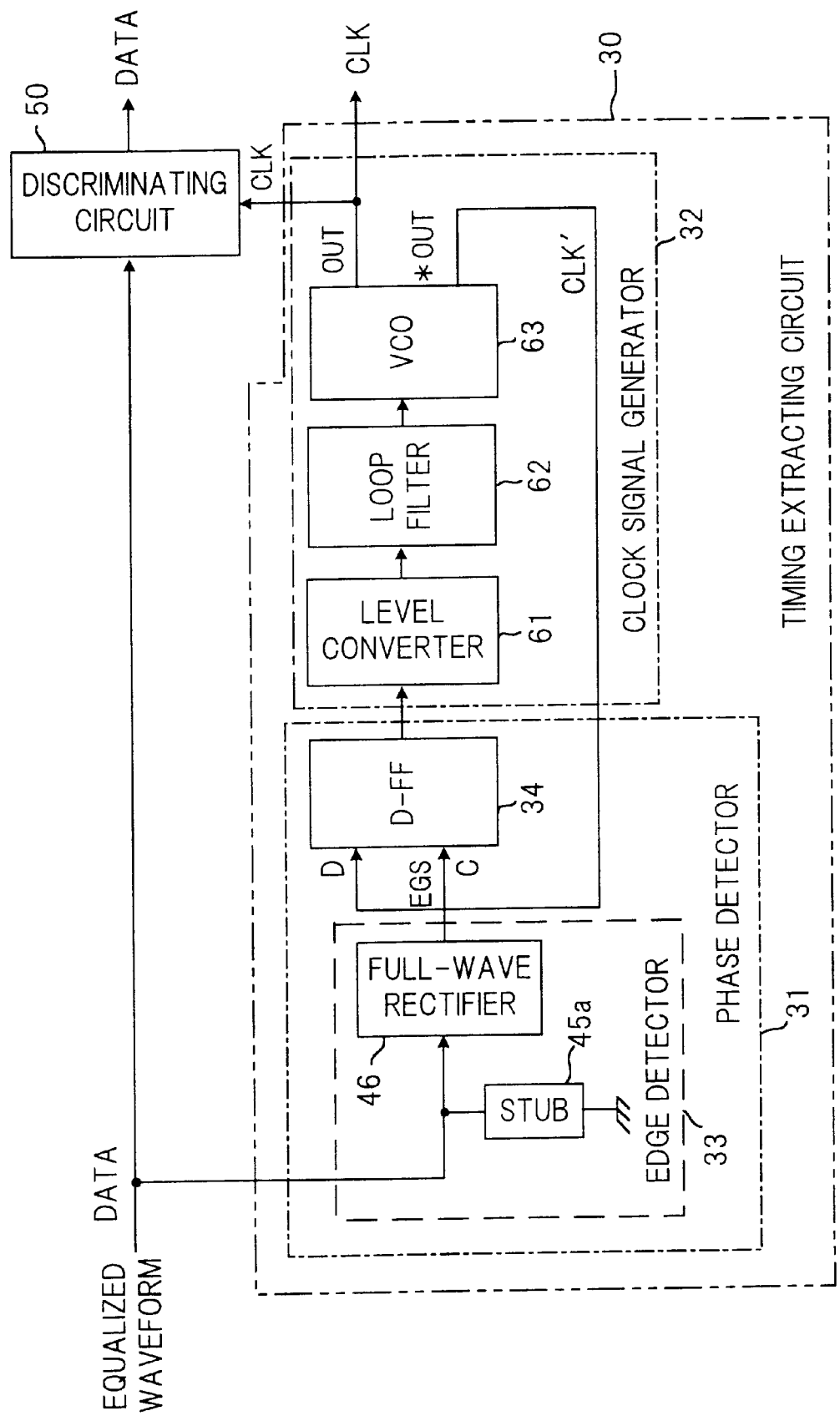
FIG. 19 shows a fifth modification of the embodiment of a timing extracting circuit shown in FIG. 14.
Figure 20:
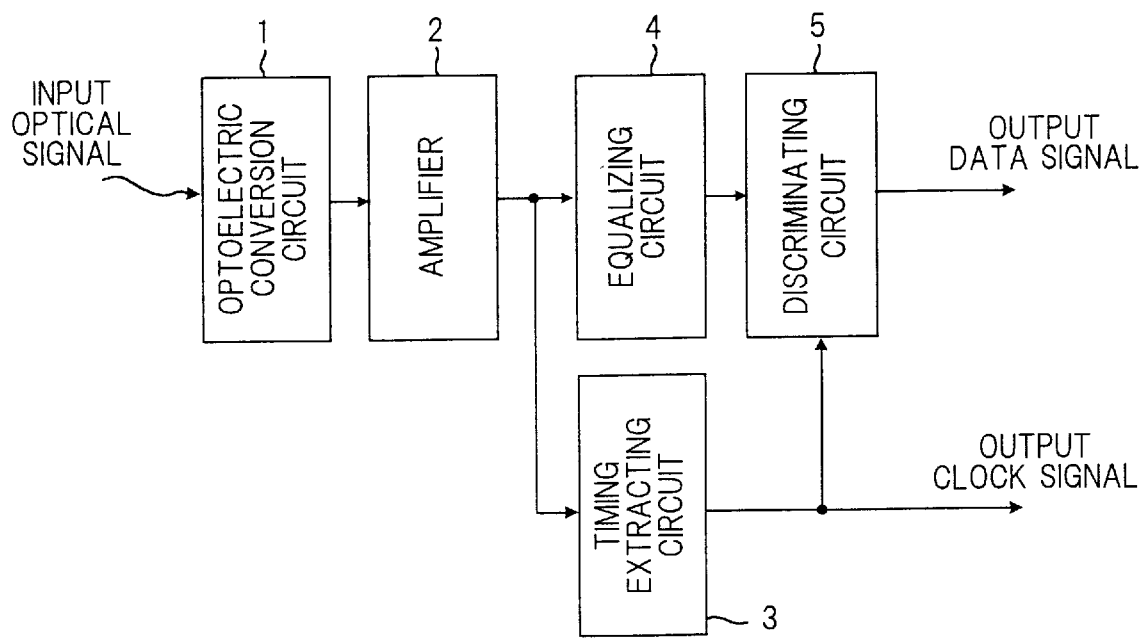
FIG. 20 is a block diagram of an optical receiver.
Figure 21:
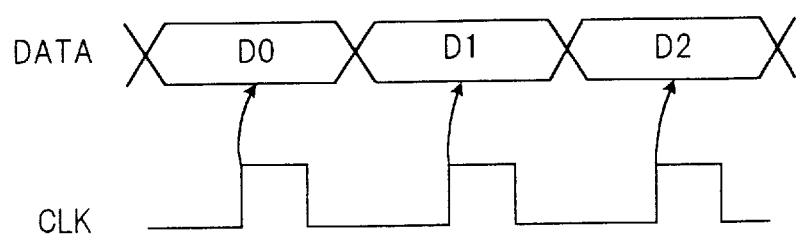
FIG. 21 shows the phase relationship between a data signal and a clock signal.
Figure 22:
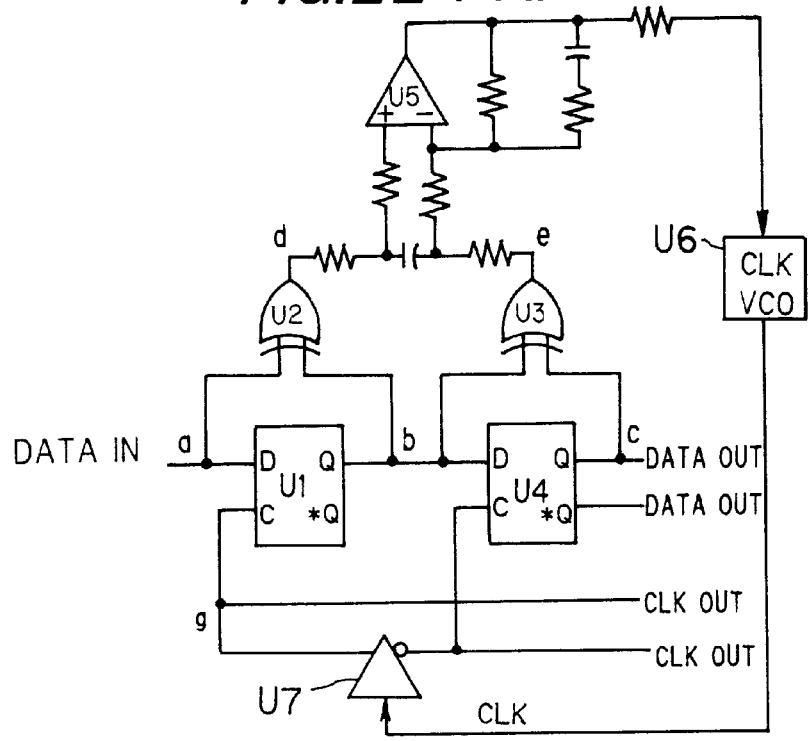
FIG. 22 is a block diagram of a conventional phase control circuit.
Figure 23:
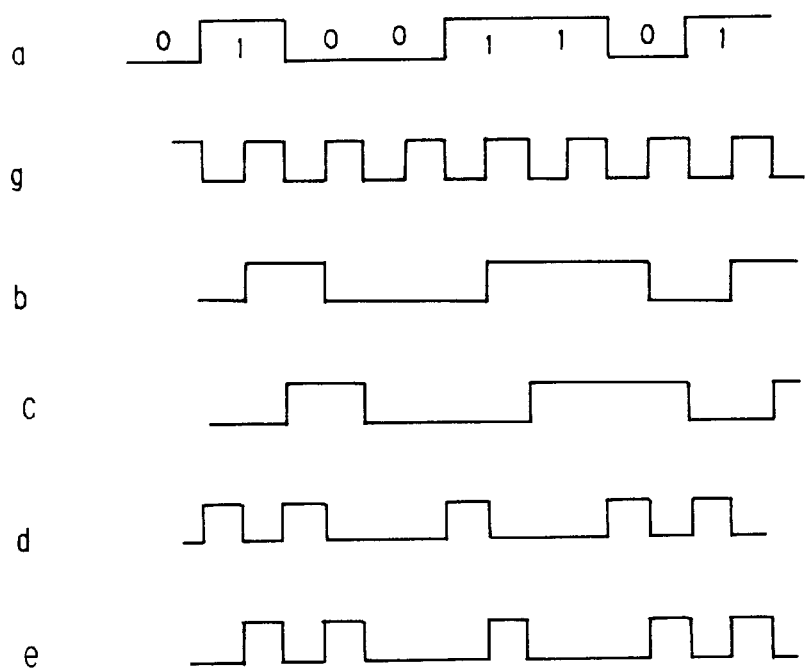
FIG. 23 shows the waveforms of the operation of the conventional phase control circuit shown in FIG. 22.

FIG. 19 shows a fifth modification of the timing extracting circuit. The same reference numerals are provided for the elements which are the same as those shown in FIG. 14. In the fifth modification, the edge detector 33 is constituted by the edge detector shown in FIG. 12. In FIG. 19, the reference numeral 45a denotes a stub constituting a differentiator, and 46 a full-wave rectifier for generating an edge signal EGS which rises at the rising edge and the falling edge of the data signal DATA by the full-wave rectification of the output signal of the differentiator.

As explained above, according to the present invention, since a phase detector is constituted by an edge detector for detecting an edge of a data signal and one D flip flop (D-FF), and the phase detector detects and outputs the averaged phase of the phase of each clock signal at the rising edge and the falling edge of the data signal, it is unnecessary to adjust the phase between two D-FFs as in a conventional phase detector. In addition, it is possible to detect a phase by a simple circuitry structure. Particularly, an edge detector can be realized by a simple structure of (1) a delay circuit and a multiplier, (2) a delay circuit and an EXOR circuit, (3) a delay circuit and a mixer, (4) a differentiator and a full-wave rectifier, or (5) a differentiator using a stub and a full-wave rectifier. It is thus possible to reduce the circuitry scale of a phase detector.

Furthermore, according to the present invention, since a timing extracting circuit is constituted by a PLL including the above-described phase detector, high-speed operation is possible, and even if the duty of a data signal varies, it is possible to generate a clock signal at the center of the data signal. It is therefore possible to detect the data signal at the center of the data signal which has the largest margin for discrimination. In addition, according to the present invention, since the circuitry structure of the phase detector is reduced, the circuitry structure of the timing extracting circuit is also reduced as a whole.

As many apparently widely different embodiments of the present invention can be made without departing from the spirit and scope thereof, it is to be understood that the invention is not limited to the specific embodiments thereof except as defined in the appended claims.

What is claimed is:

1. A phase detector for detecting the phase difference between a data signal and a clock signal, said phase detector comprising:

an edge detector for detecting a rising edge and a falling edge of said data signal and outputting an edge signal; and a D flip flop (D-FF) which is provided with a CLOCK input terminal to which a first signal is input, a DATA input terminal to which a second signal is input and an output terminal for outputting a stored logical value, and which stores and outputs the logical value of said second signal in the instant of a rising edge of said first signal and holds said logical signal until the rising edge of the next first signal;

wherein said edge signal is input to said CLOCK input terminal of said D-FF as said first signal;

said clock signal is input to said DATA input terminal of said D-FF as said second signal; and a signal corresponding to said phase difference between said data signal and said clock signal is taken out of said output terminal of said D-FF.

2. A phase detector according to claim 1, wherein said edge detector includes a delay circuit for delaying said data signal by a predetermined time, and a multiplier for multiplying said data signal and the output signal of said delay circuit so as to generate the edge signal which rises at the rising edge and the falling edge of said data signal.

3. A phase detector according to claim 1, wherein said edge detector includes a delay circuit for delaying said data signal by a predetermined time, and an EXOR circuit for executing an exclusive OR of said data signal and the output signal of said delay circuit so as to generate the edge signal which rises at the rising edge and the falling edge of said data signal.

4. A phase detector according to claim 1, wherein said edge detector includes a delay circuit for delaying said data signal by a predetermined time, and a mixer for mixing and multiplying said data signal and the output signal of said delay circuit so as to generate the edge signal which rises at the rising edge and the falling edge of said data signal.

5. A phase detector according to claim 1, wherein said edge detector includes a differentiator for differentiating said data signal, and a full-wave rectifier for generating the edge signal which rises at the rising edge and the falling edge of said data signal by the full-wave rectification of the output signal of said differentiator.

6. A phase detector according to claim 5, wherein said differentiator is constituted by a stub.

7. A timing extracting circuit for generating a clock signal which indicates the timing for discriminating a data signal and controlling the phase of the clock signal so that the phase relationship between the clock signal and the data signal is optimal, said timing extracting circuit comprising:

a phase detector for detecting phase difference between a data signal and a clock signal; and a clock signal generator for generating the clock signal so that said phase difference is optimal; wherein said phase detector has an edge detector for detecting a rising edge and a falling edge of said data signal and outputting an edge signal, and a D flip flop (D-FF) which is provided with a CLOCK input terminal to which a first signal is input, a DATA input terminal to which a second signal is input and an output terminal for outputting a stored logical value, and which stores and outputs said logical value of said second signal in the instant of a rising edge of said first signal and holds said logical signal until the rising edge of the next first signal;

said edge signal is input to said CLOCK input terminal of said D-FF as said first signal;

said clock signal is input to said DATA input terminal of said D-FF as said second signal; and a signal corresponding to said phase difference between said data signal and said clock signal is taken out of said output terminal of said D-FF.

8. A timing extracting circuit according to claim 7, wherein said edge detector includes a delay circuit for delaying said data signal by a predetermined time, and a multiplier for multiplying said data signal and the output signal of said delay circuit so as to generate the edge signal which rises at the rising edge and the falling edge of said data signal.

9. A timing extracting circuit according to claim 7, wherein said edge detector includes a delay circuit for delaying said data signal by a predetermined time, and an EXOR circuit for executing an exclusive OR of said data signal and the output signal of said delay circuit so as to generate the edge signal which rises at the rising edge and the falling edge of said data signal.

10. A timing extracting circuit according to claim 7, wherein said edge detector includes a delay circuit for delaying said data signal by a predetermined time, and a mixer for mixing and multiplying said data signal and the output signal of said delay circuit so as to generate the edge signal which rises at the rising edge and the falling edge of said data signal.

11. A timing extracting circuit according to claim 7, wherein said edge detector includes a differentiator for differentiating said data signal, and a full-wave rectifier for generating the edge signal which rises at the rising edge and the falling edge of said data signal by the full-wave rectification of the output signal of said differentiator.

12. A timing extracting circuit according to claim 11, wherein said differentiator is constituted by a stub.

* * * * *

UNITED STATES PATENT AND TRADEMARK OFFICE
CERTIFICATE OF CORRECTION

PATENT NO. : 6,064,236
DATED : May 16, 2000
INVENTOR(S) : Naokikuwata, et al

It is certified that error appears in the above-indentified patent and that said Letters Patent is hereby corrected as shown below:

On the title page: Item [73] Assignee:

Please change the ASSIGNEE name from FUJTISU LIMITED to FUJITSU LIMITED.

Signed and Sealed this

Third Day of April, 2001

Attest:

NICHOLAS P. GODICI

*Attesting Officer*   *Acting Director of the United States Patent and Trademark Office*